(12) United States Patent
Bauer et al.

(10) Patent No.: US 7,451,421 B1
(45) Date of Patent: Nov. 11, 2008

(54) METHODS OF IMPLEMENTING AND MODELING INTERCONNECT LINES AT OPTIONAL BOUNDARIES IN MULTI-PRODUCT PROGRAMMABLE IC DIES

(75) Inventors: Trevor J. Bauer, Boulder, CO (US); Jeffrey V. Lindholm, Longmont, CO (US); F. Erich Goetting, Cupertino, CA (US); Bruce E. Talley, Louisville, CO (US); Ramakrishna K. Tanikella, Boulder, CO (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 375 days.

(21) Appl. No.: 11/333,865

(22) Filed: Jan. 17, 2006

Related U.S. Application Data

(60) Provisional application No. 60/732,390, filed on Nov. 1, 2005.

(51) Int. Cl.
  G06F 9/455 (2006.01)
  G06F 17/50 (2006.01)
  H03K 19/173 (2006.01)
  H03K 19/177 (2006.01)
(52) U.S. Cl. .................. 716/16; 716/10; 716/11; 716/12; 326/38; 326/41
(58) Field of Classification Search .......... 716/10, 716/12, 16; 326/38, 41, 93
See application file for complete search history.

(56) References Cited

U.S. PATENT DOCUMENTS

| | | | |
|---|---|---|---|
| 5,787,007 A * | 7/1998 | Bauer | 716/16 |
| 6,157,213 A | 12/2000 | Voogel | |
| 6,160,418 A | 12/2000 | Burnham | |
| 6,204,689 B1 * | 3/2001 | Percey et al. | 326/41 |
| 6,215,327 B1 * | 4/2001 | Lyke | 326/41 |
| 6,216,257 B1 * | 4/2001 | Agrawal et al. | 716/16 |
| 6,218,864 B1 * | 4/2001 | Young et al. | 326/93 |
| 6,359,466 B1 | 3/2002 | Sharpe-Geisler | |

(Continued)

OTHER PUBLICATIONS

Xilinx, Inc.; U.S. Appl. No. 11/333,819 by Pang et al., filed Jan. 17, 2006.

(Continued)

*Primary Examiner*—Helen Rossoshek
(74) *Attorney, Agent, or Firm*—Lois D. Cartier; LeRoy D. Maunu

(57) ABSTRACT

A method of modeling two IC dies using the same software model, although the two dies include physical differences. A first programmable logic device (PLD) die includes first and second portions, and is encoded to render the first portion operational and the second portion non-operational. At a boundary between the two portions, interconnect lines traversing the boundary include a first section in the first portion and a second section in the second portion. The second PLD die includes the first portion of the first PLD die, while omitting the second portion. The interconnect lines extending to the edge of the second die are coupled together in pairs. A software model for both die includes a termination model that omits the pair coupling, adds an RC load compensating for the omitted connection, and (for bidirectional interconnect lines) flags one interconnect line in each pair as being invalid for use by routing software.

8 Claims, 14 Drawing Sheets

U.S. PATENT DOCUMENTS

| | | | | |
|---|---|---|---|---|
| 6,396,303 B1 * | 5/2002 | Young | | 326/39 |
| 6,448,808 B2 * | 9/2002 | Young et al. | | 326/41 |
| 6,944,809 B2 * | 9/2005 | Lai et al. | | 714/725 |
| 7,002,828 B2 | 2/2006 | Santin et al. | | |
| 7,028,281 B1 * | 4/2006 | Agrawal et al. | | 716/12 |
| 7,088,134 B1 * | 8/2006 | Agrawal et al. | | 326/41 |
| 7,095,253 B1 * | 8/2006 | Young | | 326/101 |
| 7,107,565 B1 * | 9/2006 | Lindholm et al. | | 716/16 |
| 7,132,851 B2 * | 11/2006 | Young | | 326/41 |
| 7,181,718 B1 * | 2/2007 | Bilski et al. | | 716/16 |
| 7,187,200 B2 | 3/2007 | Young | | |
| 7,190,190 B1 | 3/2007 | Camarota et al. | | |
| 7,193,433 B1 * | 3/2007 | Young | | 326/38 |
| 7,196,543 B1 * | 3/2007 | Young et al. | | 326/38 |
| 7,199,610 B1 * | 4/2007 | Young et al. | | 326/41 |
| 7,202,697 B1 * | 4/2007 | Kondapalli et al. | | 326/38 |
| 7,202,698 B1 * | 4/2007 | Bauer et al. | | 326/41 |
| 7,205,790 B1 * | 4/2007 | Young | | 326/38 |
| 7,215,138 B1 * | 5/2007 | Kondapalli et al. | | 326/38 |
| 7,218,139 B1 * | 5/2007 | Young et al. | | 326/38 |
| 7,218,140 B1 * | 5/2007 | Young | | 326/38 |
| 7,218,143 B1 * | 5/2007 | Young | | 326/41 |
| 7,221,186 B1 * | 5/2007 | Young | | 326/38 |
| 7,233,168 B1 * | 6/2007 | Simkins | | 326/38 |
| 7,253,658 B1 * | 8/2007 | Young | | 326/38 |
| 7,256,612 B1 * | 8/2007 | Young et al. | | 326/41 |
| 7,265,576 B1 * | 9/2007 | Kondapalli | | 326/38 |
| 7,268,587 B1 * | 9/2007 | Pham et al. | | 326/41 |
| 7,274,214 B1 * | 9/2007 | Young | | 326/41 |
| 7,276,934 B1 * | 10/2007 | Young | | 326/38 |
| 7,279,929 B1 * | 10/2007 | Young | | 326/41 |
| 7,301,824 B1 * | 11/2007 | New | | 365/189.011 |
| 7,337,422 B1 * | 2/2008 | Becker et al. | | 716/16 |
| 7,345,507 B1 * | 3/2008 | Young et al. | | 326/41 |
| 2003/0116835 A1 | 6/2003 | Miyamoto et al. | | |
| 2005/0112614 A1 * | 5/2005 | Cook et al. | | 435/6 |
| 2007/0035330 A1 * | 2/2007 | Young | | 326/41 |
| 2007/0204252 A1 * | 8/2007 | Furnish et al. | | 716/10 |

OTHER PUBLICATIONS

Xilinx, Inc.; U.S. Appl. No. 11/334,341 by Goetting et al., filed Jan. 17, 2006.

Xilinx, Inc.; U.S. Appl. No. 11/333,991 by Young et al., filed Jan. 17, 2006.

Xilinx, Inc.; U.S. Appl. No. 11/333,990 by Young et al., filed Jan. 17, 2006.

Xilinx, Inc.; U.S. Appl. No. 10/956,544 by Kondapalli filed Oct. 1, 2004.

Xilinx, Inc.; U.S. Appl. No. 10/970,964 by Vadi et al., filed Oct. 22, 2004.

* cited by examiner

METHODS OF IMPLEMENTING AND MODELING INTERCONNECT LINES AT OPTIONAL BOUNDARIES IN MULTI-PRODUCT PROGRAMMABLE IC DIES

FIELD OF THE INVENTION

The invention relates to integrated circuit devices (ICs). More particularly, the invention relates to structures and methods of providing multiple ICs of different sizes (e.g., a family of related programmable logic devices) from a single die.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLD providers typically provide "families" of PLDs, i.e., groups of related PLD products of different sizes. For example, a family of PLDs might all use the same basic tile, but include different numbers of the tiles, so they have different logic capacities. Therefore, a PLD user does not need to pay for a PLD with a much larger capacity than he or she actually requires to implement a particular design. A typical method of generating a family of PLDs is to first manufacture the family member having the greatest anticipated customer demand. Once the first family member has been debugged and characterized and is deemed to meet the product specifications, other family members are manufactured, e.g., with each new family member being different from the one before. Each new member of the PLD family requires a new mask set, at a cost that can exceed one million dollars per mask set. Therefore, purchasing mask sets for a family of PLDs can be very costly.

It is desirable to provide structures and methods that can reduce the cost of manufacturing families of PLDs and/or other integrated circuits (ICs). It is also desirable to provide structures and methods that can reduce the production cost of an individual IC included in such a family.

SUMMARY OF THE INVENTION

The invention provides methods of manufacturing a family of packaged integrated circuits (ICs) having at least two different logic capacities, and multi-product dies that can be used to implement such methods. A first IC die includes at least two different portions, of which at least one portion can be deliberately rendered non-operational in some manner (e.g., non-functional, inaccessible, and/or non-programmable) within the package. A first set of the first IC dies are packaged such that both portions of the dies are operational. A second set of the first IC dies are packaged such that only the first portion of each die is operational. Once the first and second sets are packaged and the second set of ICs has been evaluated, a decision can be made whether or not to manufacture a second IC die that includes the first portion of the first die, and excludes the second portion. Thus, for example, if the second set of packaged ICs proves to be popular with customers, or proves to be fully functional as desired, the second IC die can be manufactured as a cost saving measure. If the second set of packaged ICs proves to be unpopular or contains a design defect, the cost of a mask set for the second IC die has been avoided.

In some embodiments, the ICs are programmable logic devices (PLDs). The first and second portions of the first PLD die can be configured together with a single configuration bit stream. When packaged such that the second portion is non-operational, the first PLD die can be configured with a second configuration bit stream smaller than the first configuration bit stream, and this second bit stream can also be used to configure the second PLD die. Thus, by packaging the partially operational first die in the same package as the second die, the two products can be interchangeably supplied to customers, who can use either product in a system in a transparent manner.

In some embodiments of the first PLD die, the selection of a configuration path for the bit stream (e.g., configuring the entire PLD or only the first portion of the PLD) is controlled by a product selection code. A first value of the product selection code selects the option where both the first and second portions of the first die are operational. A second value of the product selection code selects the option where only the first portion of the first die is operational. In one embodiment, the second IC die is also identified with the first value of the product selection code (i.e., the first product selection code signifies "configure the entire IC"). In another embodiment, the second IC die is identified with the second value of the product selection code (i.e., the second product selection code signifies "configure only the first portion of the IC"). In yet another embodiment, the second IC die is designed to accept either the first or the second value of the product selection code, and in either case, to configure the entirety of the second IC die.

The product selection code can be stored, for example, in non-volatile memory or a fuse structure, or can be configured as a package bonding option. For example, in one embodiment, each package includes jumpers (added elements such as wires external to the die) that tie each bit of the product selection code to a power high or ground pin of the package. In some embodiments, the product selection code also enables boundary scan for the operational portion of the die, and omits from the boundary scan chain any portions of the die that are deliberately rendered non-operational.

According to another aspect of the invention, an IC die (e.g., a PLD die) is manufactured that has the capability of being configured as at least two differently-sized family members, e.g., as described above. The IC die is tested prior to packaging. If the first portion of the IC die is fully functional, but the second portion includes a localized defect, then the IC die is packaged with a product selection code that configures the IC die to operate as only the first portion of the die. (A localized defect is a defect that affects only a small part of the IC functionality.) The second portion of the die is deliberately rendered non-operational. Therefore, the IC die can still be sold as a fully functional packaged IC.

According to yet another aspect of the invention, a method is provided of modeling two IC dies (e.g., two PLD dies) using the same software model, even though the two IC dies include physical differences. For example, a first PLD die includes first and second portions, e.g., as described above, and is encoded to render the first portion operational and the second portion non-operational. At a boundary between the two portions, interconnect lines traversing the boundary include a first section in the first portion and a second section in the second portion. The second PLD die includes the first portion of the first PLD die, and omits the second portion. To maintain consistent loading, the interconnect lines extending to the edge of the second die are coupled together in pairs, with each resulting piece of wire being of essentially the same length as the corresponding wires in the first PLD die.

The same software model can be used for the encoded first die and the second die, even though the physical structures are different. In one embodiment, this is accomplished by providing a termination model that omits the pair coupling, adds an RC load to compensate for the omitted connection, and (in the case of bidirectional interconnect lines) flags one interconnect line in each pair of interconnect lines as being invalid for use by routing software for the PLD.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, many aspects of the present invention are not so limited.

Figure 1:
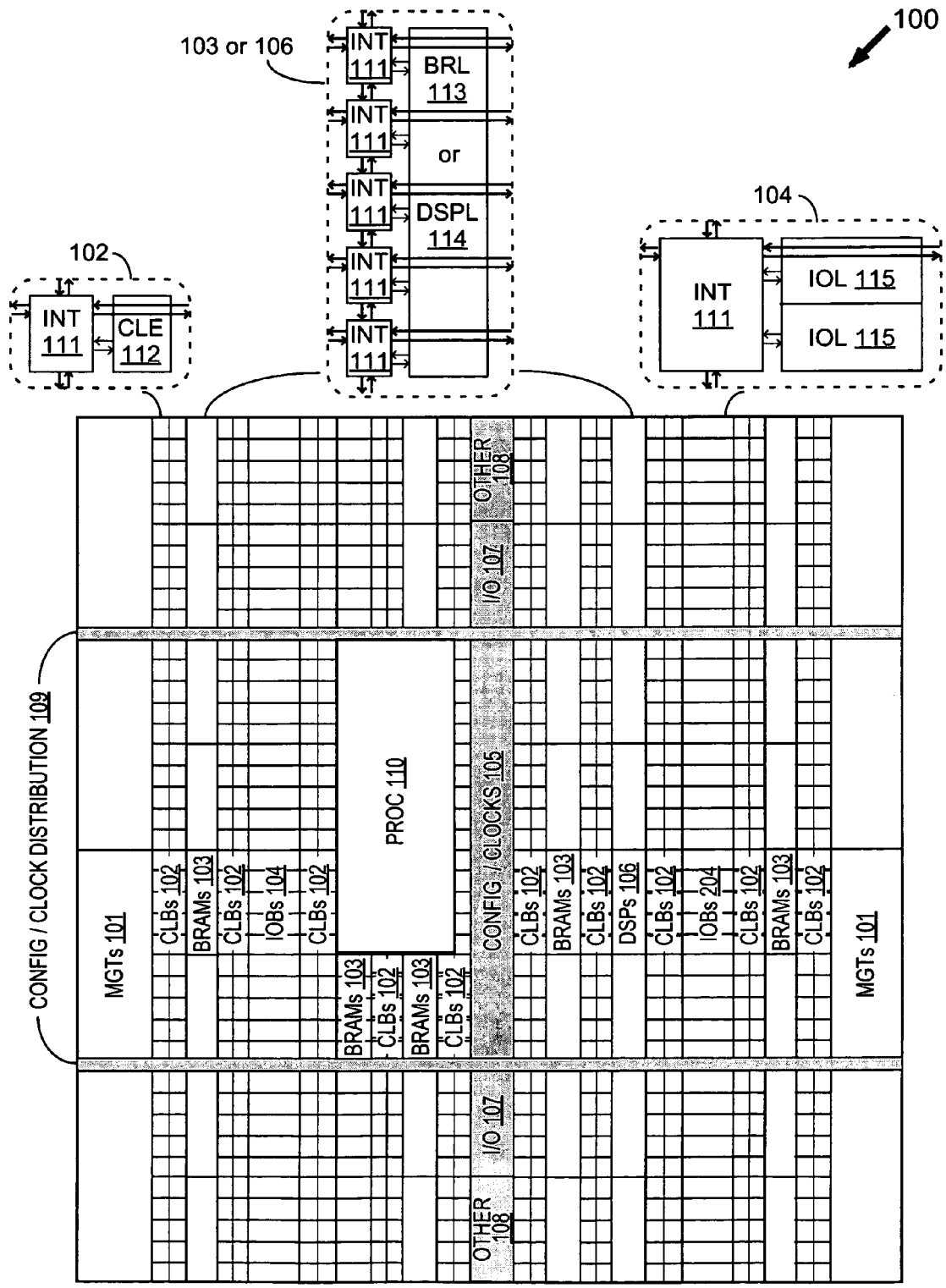
FIG. 1 illustrates an FPGA architecture that includes several different types of programmable logic blocks.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
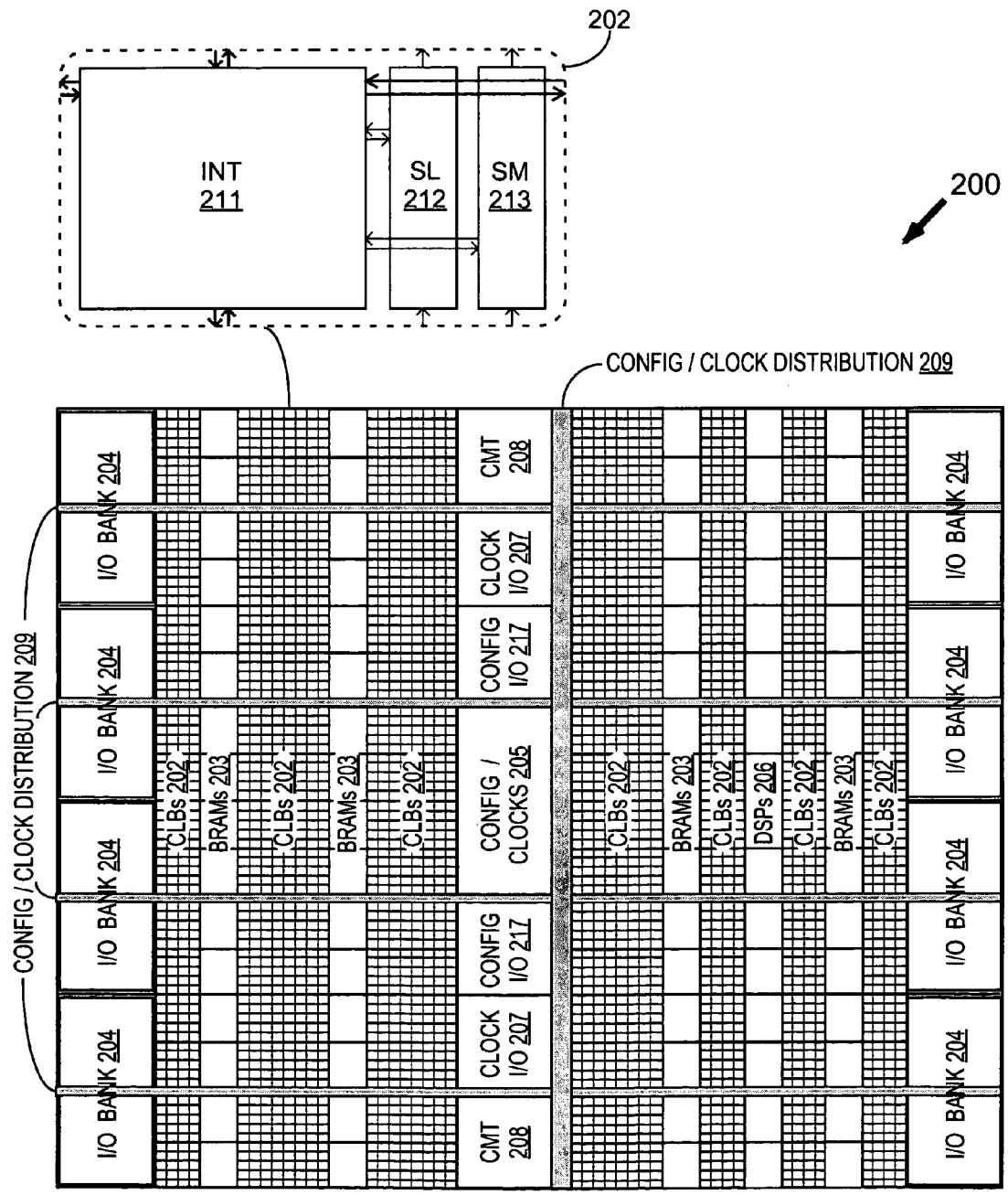
FIG. 2 illustrates another FPGA architecture that includes several different types of programmable logic blocks.

FIG. 2 illustrates an exemplary FPGA 200 utilizing the general architecture shown in FIG. 1. The FPGA of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA of FIG. 2, an exemplary CLB 202 includes a single programmable interconnect element (INT 211) and two different "slices", slice L (SL 212) and slice M (SM 213). In some embodiments, the two slices are the same (e.g., two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
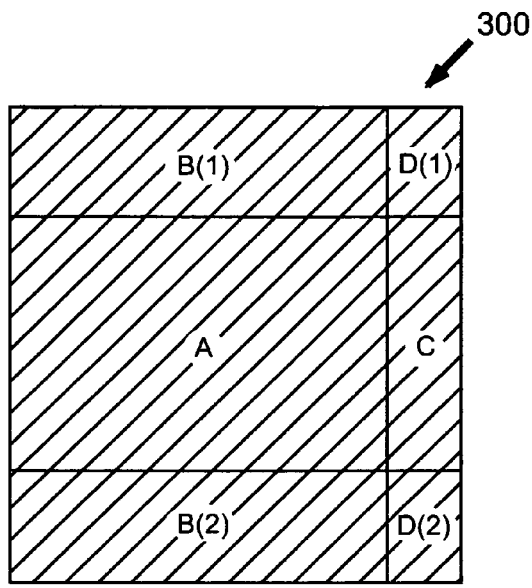
FIG. 3 illustrates a multi-product IC die including several different portions, in which all of the portions are operational.

FIG. 3 illustrates a multi-product IC die 300, i.e., an IC die that can be configured as two or more different ICs. For example, the multi-product die of FIG. 3 can be a multi-product PLD die that can be configured as several different PLDs having different logic capacities. The operational portions are shown with a diagonal fill pattern. Thus, in the IC product shown in FIG. 3, the die 300 is configured so that all portions (A, B(1), B(2), C, D(1), and D(2)) are operational. Note that the die represented by this simple block diagram may also include small amounts of logic and/or interconnect lines that "finish off" the die edges. For example, rows or columns of termination tiles may be included on all four edges of the die. Termination tiles are described in more detail in conjunction with FIG. 15, below.

Figure 4:
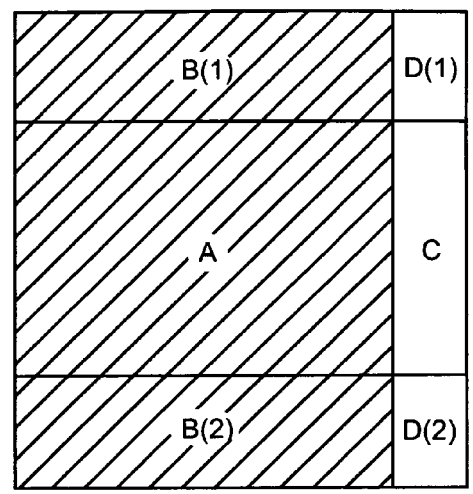
FIG. 4 illustrates the IC die of FIG. 3 in which first portions of the die are deliberately rendered non-operational.

FIG. 4 shows the same multi-product die as FIG. 3, but only portions A, B(1), and B(2) are operational. Portions C, D(1), and D(2) are deliberately rendered non-operational. This can be accomplished in any of several ways. For example, when the IC die is a PLD die, the non-operational portions can be configured so that the configuration bit stream for the PLD bypasses these portions. Additionally or alternatively, the non-operational portions can be isolated from power sources. For example, an IC die typically includes many power pins. The different portions of the multi-product die can be coupled to different power pins, and the power pins of the non-operational portions can be coupled to one or more ground pins of the IC package, instead of being coupled to power pins of the package. In some embodiments, a boundary scan chain is modified to bypass the non-operational portions, as is later described in conjunction with FIG. 20.

Figure 5:
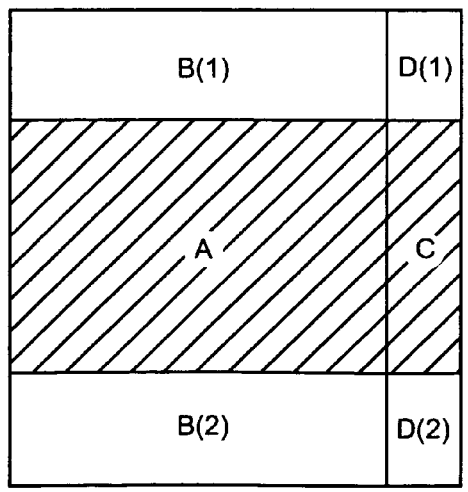
FIG. 5 illustrates the IC die of FIG. 3 in which second portions of the die are deliberately rendered non-operational.
Figure 6:
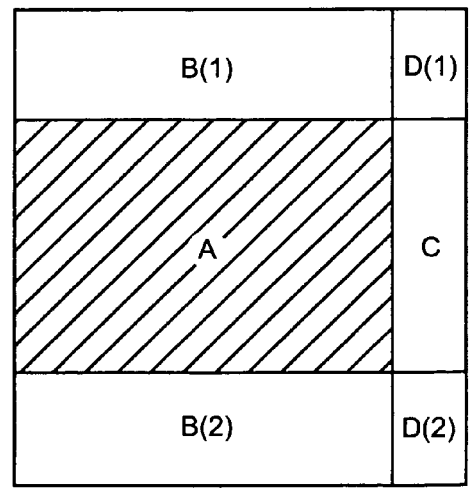
FIG. 6 illustrates the IC die of FIG. 3 in which third portions of the die are deliberately rendered non-operational.

FIG. 5 also shows the same multi-product die as FIG. 3, but only portions A and C are operational. Portions B(1), B(2), D(1), and D(2) are deliberately rendered non-operational. FIG. 6 shows yet another configuration of the multi-product die of FIG. 3, in which only portion A is operational, while portions B(1), B(2), C, D(1), and D(2) are deliberately rendered non-operational.

Thus, it can be seen that the single die 300 yields four different products, each including different (and in this example, overlapping) portions of the complete die. When this approach is used, four products are obtained while manufacturing only one mask set. Clearly, where the cost of the three eliminated mask sets is more significant than the continuing costs of manufacturing the dies, a cost saving has been effected. However, if one or more of these smaller products (e.g., the products illustrated in FIGS. 4-6) proves to be very popular with customers, a new mask set can be ordered, and the product can be manufactured as a smaller die, with the consequent reduction in costs. In one embodiment, early in the product cycle a family of products is manufactured from a single multi-product die, and later in the product cycle each family member is manufactured from an individual die. For example, engineering samples can be obtained from a multi-product die, while production ICs are obtained using prior art methods. In some embodiments, dies are obtained from both sources at the same time.

Note that more than four products could be obtained from the IC die of FIG. 3, if desired. For example, a product could be obtained that includes portions A and B(1) of IC die 300, or portions A, C, B(1) and D(1), or some other combination of the portions illustrated in FIG. 3.

Figure 7:
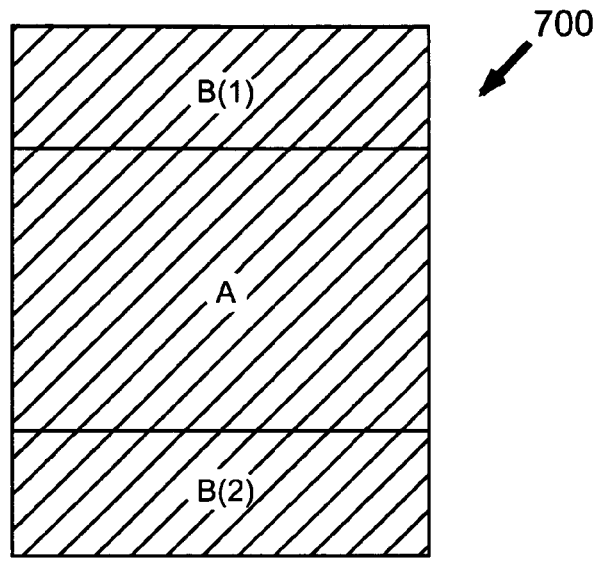
FIG. 7 illustrates a second IC die that can be manufactured, if desired, which includes the operational portions of FIG. 4.
Figure 8:
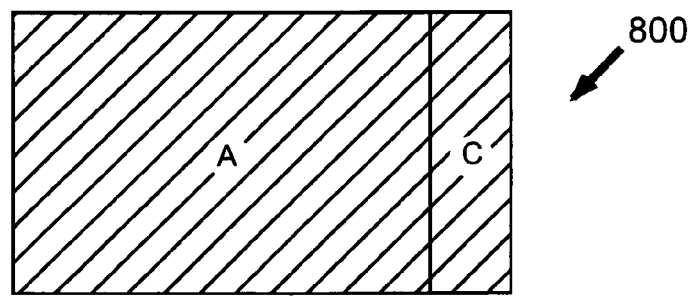
FIG. 8 illustrates a third IC die that can be manufactured, if desired, which includes the operational portions of FIG. 5.
Figure 9:
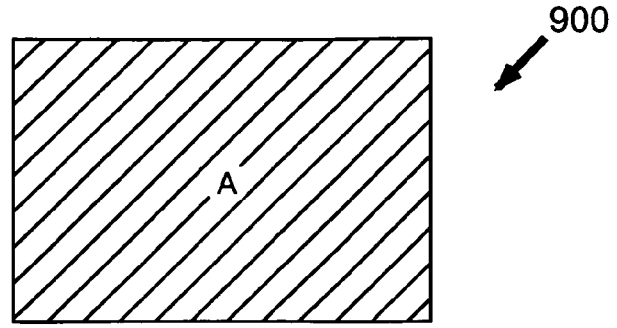
FIG. 9 illustrates a fourth IC die that can be manufactured, if desired, which includes the operational portions of FIG. 6.

FIG. 7 shows a smaller die 700 that can be manufactured, as desired, if the product illustrated in FIG. 4 proves to be highly popular. Similarly, FIG. 8 shows the smaller die 800 corresponding to the product of FIG. 5, and FIG. 9 shows the smaller die 900 corresponding to the product of FIG. 6. Note that in the smaller dies of FIGS. 7-9, the omission of portions of the larger die may require the addition of small amounts of logic and/or interconnect lines that "finish off" the die edges. For example, rows or columns of termination tiles can be added to these smaller dies, as described in more detail in conjunction with FIG. 15, below.

In some embodiments, the smaller dies (e.g., the dies of FIGS. 7-9) can be shipped to customers without significant impact on the customers' systems, previously implemented using the corresponding products (e.g., from FIGS. 4-6). For example, the corresponding products can be packaged in IC packages having the same type and size, with the same pinouts, e.g., by utilizing flip-chip packaging. The same software model can be provided for the two corresponding products, as is later described in conjunction with FIGS. 14-19.

Figure 10:
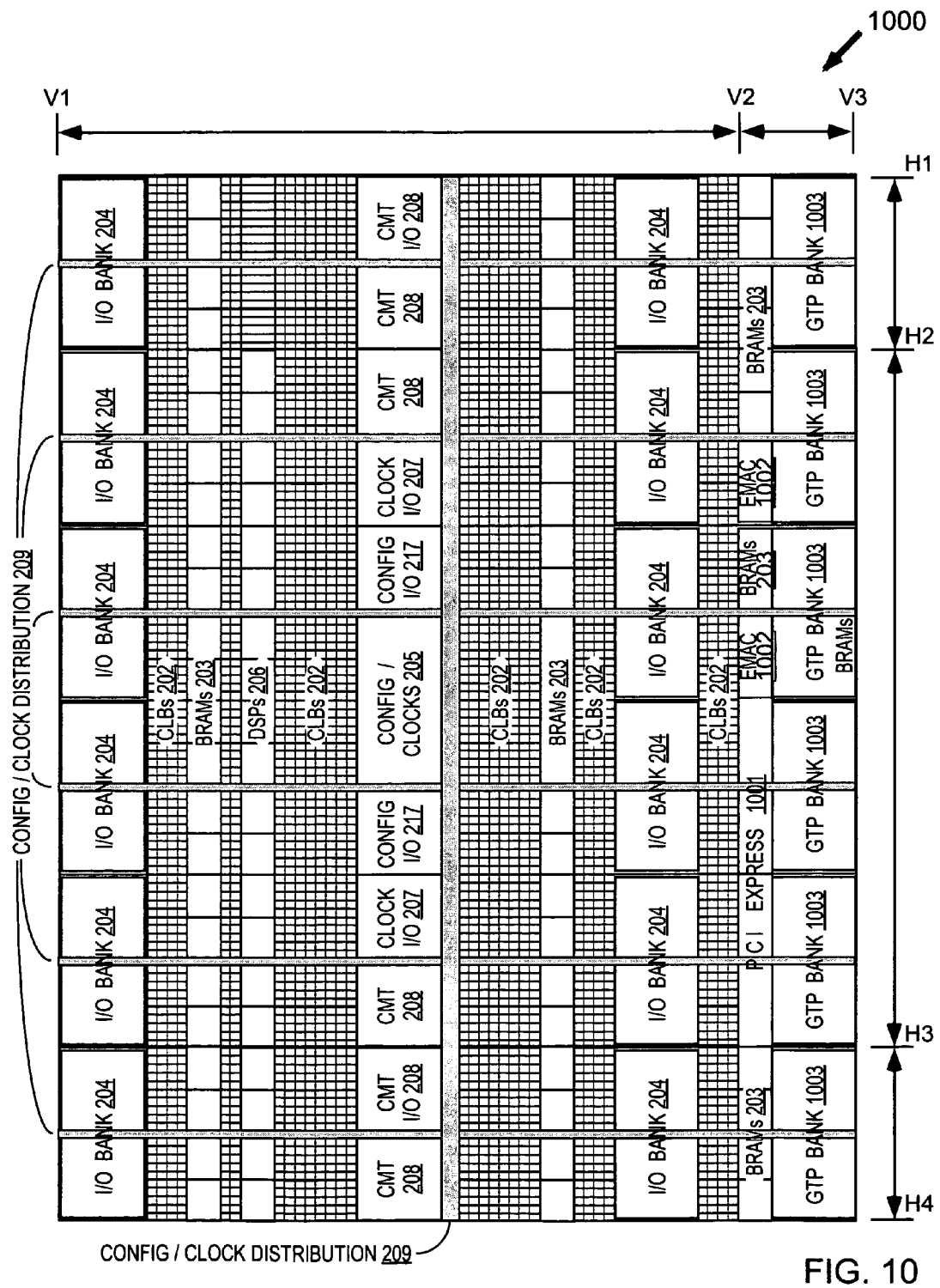
FIG. 10 illustrates an FPGA architecture that includes several different types of programmable logic blocks, and which can be used, for example, as the first IC die illustrated in FIG. 3.

FIG. 10 illustrates an exemplary FPGA implemented as a multi-product die 1000. For example, comparing die 1000 with die 300 of FIG. 3, it can be seen that portion B(1) corresponds to the area delineated by vertical lines V1 and V2, and horizontal lines H1 and H2. Portion A corresponds to the area delineated by vertical lines V1 and V2, and horizontal lines H2 and H3. Portion B(2) corresponds to the area delineated by vertical lines V1 and V2, and horizontal lines H3 and H4. Portion D(1) corresponds to the area delineated by vertical lines V2 and V3, and horizontal lines H1 and H2. Portion C corresponds to the area delineated by vertical lines V2 and V3, and horizontal lines H2 and H3. Portion D(2) corresponds to the area delineated by vertical lines V2 and V3, and horizontal lines H3 and H4.

Note that the exemplary multi-product FPGA die of FIG. 10 is implemented using a columnar architecture, as are the FPGAs of FIGS. 1 and 2. The columnar architecture (e.g., in which the input/output blocks occur in vertical columns) facilitates the implementation of the multi-product die by simplifying the logic that enables and disables portions of the die, and simplifies the effort to provide consistent packaging among the various products derived from the die.

As in the FPGAs of FIGS. 1 and 2, the multi-product die of FIG. 10 can include many different types of logic blocks. The exemplary die of FIG. 10 is selected for illustration because the simplicity of the architecture does not obscure the inventive concept. However, additional types and sizes of logic blocks can also be included in the multi-product die, if desired. In addition to the logic blocks shown in FIG. 2, which are identified by the same element numbers in the two figures, the multi-product die of FIG. 10 includes the following design elements: logic block 1001, which implements the well-known PCI Express interface; EMAC logic blocks 1002, which implement the well-known Ethernet MAC interface; and GTP banks 1003, which include low power versions of well-known multi-gigabit transceivers.

Clearly, the multi-product die of FIG. 10 includes several optional internal boundaries at which the operational portions can optionally be separated from portions that are deliberately rendered non-operational. For example, horizontal lines H2 and H3 provide such boundaries, as does vertical line V2. Care is preferably taken so that these boundaries do not intersect functional logic blocks. Note, however, that the boundaries between portions of the die are not necessarily straight lines, as shown in the examples herein. The boundaries can be adjusted to ensure that they include complete logic blocks, if necessary. However, the use of straight-line boundaries facilitates the manufacture of smaller dies that include only portions of the original multi-product die, e.g., as shown in FIGS. 7-9. The "row and column" organization illustrated in FIG. 10, for example, facilitates the use of straight boundary lines in a multi-product die.

The multi-product die of FIG. 10 is designed to be easily segmented. For example, the interconnect structure of the die is preferably designed to include only repetitive interconnect, e.g., the "high fanout" interconnect structure included in many known FPGAs can be omitted. The clock structure, also, is designed to be operable when only portions of the die are operational. The configuration and clock distribution logic 209 shown in FIG. 10 is designed as a "tree" that expands horizontally from a center column, then spreads vertically both up and down from the horizontal "branches". In the embodiment of FIG. 10, the optional boundaries H2 and H3 are placed such that they do not intersect the final vertical extensions of the clock and configuration tree.

Figure 11:
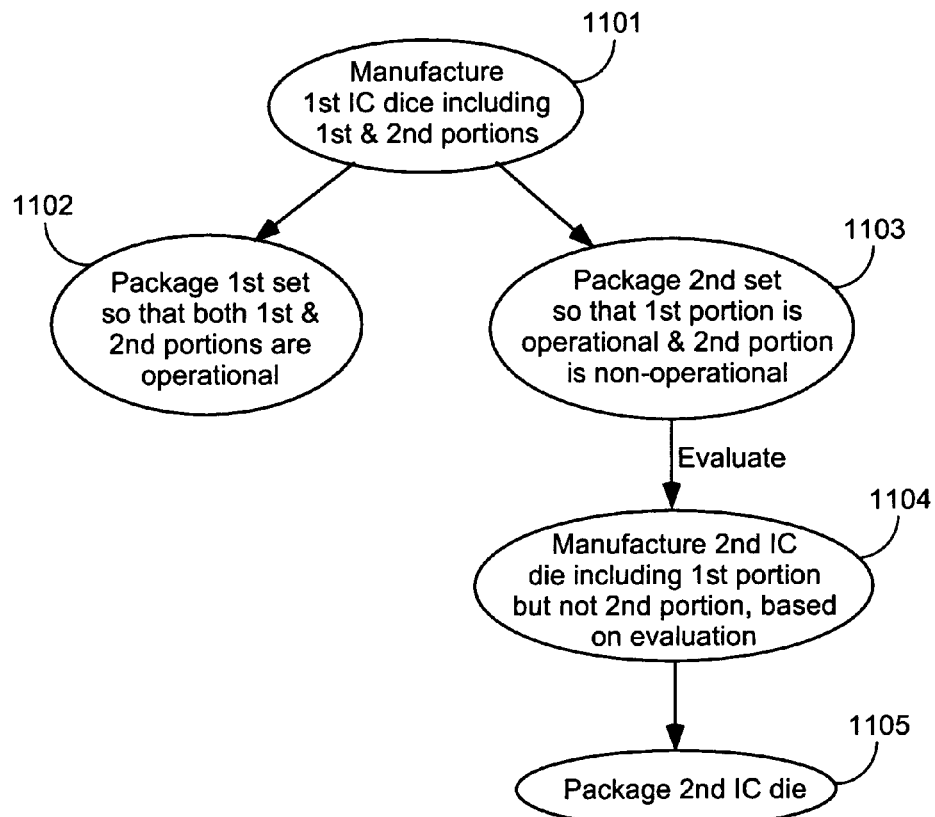
FIG. 11 illustrates the steps of an exemplary method of manufacturing a family of related IC dies.

FIG. 11 illustrates the steps of an exemplary method of manufacturing a family of related IC dies, starting with a multi-product die. In step 1101, two or more first IC dies are manufactured, where each of the first IC dies includes a first portion and a second portion. In step 1102, at least one of the first IC dies is packaged so that both the first portion and the second portion are operational (e.g., fully functional, accessible to the user, and/or programmable by a configuration bit stream when the IC is a PLD). This step results in a packaged integrated circuit in which the entire multi-product die is fully operational. Note that the terms "packaging", "packaged IC", and other related terms refer to the process of assembling a die structure that includes an IC die and typically provides a physical interface between a system and the IC die, and/or the structure resulting from such a process. In a preferred embodiment, the IC dies are packaged in flip-chip packages. However, the methods and structures of the invention are not limited to processes and assemblies involving flip-chip packages, nor to other types of IC packages currently known, but can be applied to other die assemblies, including die assemblies that have not yet been developed.

In step 1103, at least one of the first IC dies is packaged so that the first portion is operational, and the second portion is rendered non-operational in some manner. For example, the second portion can be rendered non-functional by disconnecting it from the power supply, can be made inaccessible by a system and by other logic included on the die, and/or can be made non-programmable in the case of a PLD.

In step 1104, a second IC die is manufactured, based on an evaluation relating to the die produced by step 1103. The evaluation might be an evaluation of the die itself, or an assessment of other factors relating to the die. For example, the decision can be made to order a mask set and manufacture the second IC die when dies resulting from step 1103 prove to have very good sales figures, or when test results show that the dies from step 1103 are fully functional. The evaluations relating to the second IC die might include, additionally or alternatively, an assessment of customer demand, yield results, production risks, production costs, inventory costs, availability of engineering resources, and so forth.

In some embodiments, the first IC die is packaged in step 1102 with a first product selection code, and in step 1103 with a second product selection code. For example, a multi-product die configurable as four different dies (e.g., as shown in FIGS. 3-6) can have a two-bit product selection code coded into the packaged part. For example, in one embodiment code "11" selects the configuration shown in FIG. 3, wherein neither rows nor columns are rendered non-operational. Code "10" selects the configuration shown in FIG. 5, where some rows (the topmost and bottommost rows of logic blocks) are rendered non-operational. Code "01" selects the configuration shown in FIG. 4, where some columns (the rightmost columns of logic blocks) are rendered non-operational. Code "00" selects the configuration shown in FIG. 6, where some rows (the topmost and bottommost rows) and some columns (the rightmost columns) of logic blocks are rendered non-operational.

In some embodiments, the second IC die is packaged with the first product selection code. For example, when the code "11" selects a fully operational die, the same code "11" can be used for the second IC die, which is also fully operational. In another embodiment, the code for the die packaged in step 1103 is also used in step 1104. In this embodiment, the code identifies the operational portion(s), no matter what the derivation of the final product. In some embodiments, the second IC die has no product selection code, because the die is not designed such that any portion(s) of the die can be rendered non-operational. In other embodiments, the second IC die is designed to render the entire die operational regardless of the value of the product selection code (e.g., the product selection code is a "don't care" value).

A product selection code can be included in a packaged IC using any of several methods. For example, the code can be stored on the IC die itself in a non-volatile memory provided for that purpose. Alternatively or additionally, the code can be set by selectively fusing some or all of a set of fuses (e.g., polysilicon fuses) included in the IC die. Alternatively or additionally, the code can be set using a packaging option, e.g., by selectively coupling one or more nodes within the IC die (e.g., the bits of the product selection code) to one or more constant-value pins inside the packaged IC. In some embodiments, the code is set by either coupling the bits of the product selection code to ground within the package, or by leaving the bits unbonded. An internal pull-up ensures that an unbonded product selection code bit is pulled to a high value. In some embodiments, multiple methods are provided for encoding the product selection, to ensure success of the encoding process. In some embodiments a fuse circuit output signal and a signal from a package bump (enabling a package option) are ORed together, such that either of these methods can be used to set the product selection code. For example, if the package bump is tied to ground, the output signal from the fuse circuit determines the value of the product selection code. Alternatively, if the fuse is grounded, the signal from the package bump determines the value of the product selection code. In some embodiments having multiple methods of setting the product selection code, one method overrides one or more other methods. For example, in one embodiment one or more blown fuses always determine the product selection code, regardless of a value designated by a connection within the package. This embodiment is useful when there is a need to redefine a die after packaging to meet changing customer demands.

In some embodiments, the product selection code also sets an IC identification code to uniquely describe the product. For example, the product selection code can control a multiplexer to select one of four stored identification codes identifying the four products that can be produced from the single multi-product die. This IC identification code can be used, for example, to identify the device, the fabrication facility, the date of fabrication, revision numbers, numbers of rows and/or columns of CLBs, or to provide other information regarding the device. The IC identification code can be used, for example, to provide information about the product via a JTAG boundary scan process.

In step 1105, the second IC die is packaged, preferably using the same package that was used to package the second set of first IC dies in step 1103. If the same package is used and the dies are carefully designed, the die produced in step 1105 can be used interchangeably with the dies produced in step 1103.

Figure 12:
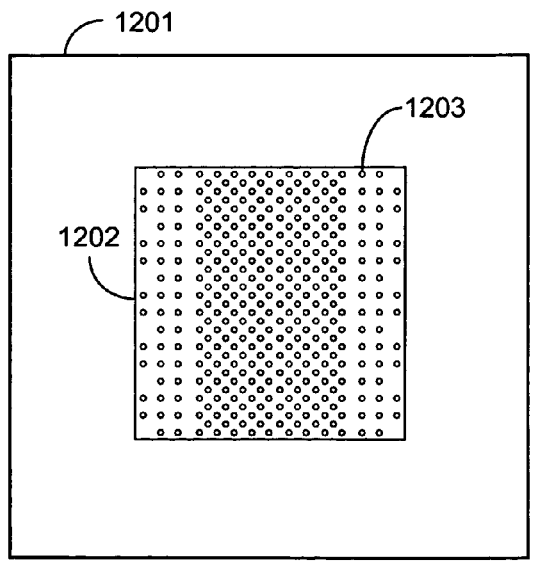
FIG. 12 illustrates a flip-chip package including a multi-product die.
Figure 13:
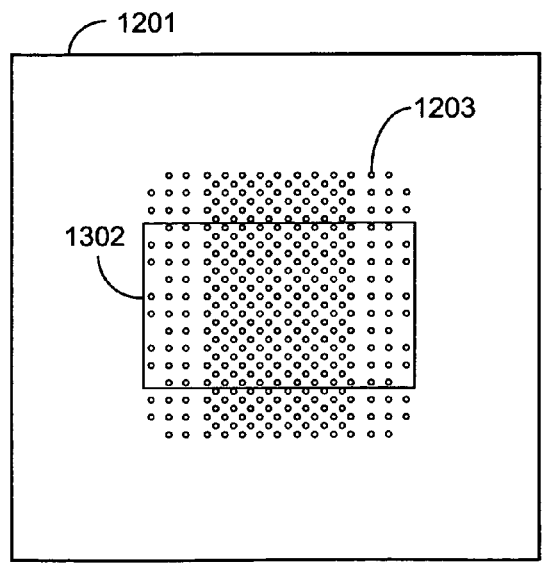
FIG. 13 illustrates the flip-flip package of FIG. 12 including a smaller die.

For example, flip-chip technology, which is well known, can be used to package the dies, as is now described in conjunction with FIGS. 12 and 13. In flip-chip packaging, no wire bonding is needed. The flip-chip package includes a piece part (1201) on which the IC die is placed. Solder bumps on the IC die make contact with corresponding bump pads (e.g., bump pad 1203) on the piece part. When the larger die (1202) is packaged in step 1103, the die will make contact with a larger number of the bump pads, e.g., all of the bump pads in the piece part might be in contact with the IC die, as shown in FIG. 12. However, signals to and from the non-operational portions of the IC, are not necessarily placed into contact with the rest of the system, because there is no reason to do so.

FIG. 13 shows the same piece part (1201) used with a smaller die (1302) that includes only the operational portions of the die of FIG. 12. The smaller IC die (e.g., the die packaged in step 1105), when packaged using the same piece part, will make contact with fewer of the bump pads on the piece part, and the unused bump pads are left without connections. For example, in FIG. 13 bump pad 1203 is not connected to the die 1302. In some embodiments, the I/Os that are critical to the functionality of the dies (e.g., configuration pins, global clock pins) are placed in the region that is always connected to the package, regardless of which die is used. In some embodiments, these unused bump pads are passivated using any of the known passivation methods, e.g., to prevent oxidation and/or other deterioration.

In some embodiments, the packages utilized in steps 1102, 1103, and 1105 all utilize the same piece part. In another embodiment, the package utilized in step 1105 is the same as the package utilized in step 1103, but different from the package utilized in step 1102. In some embodiments, a family of PLDs includes the family members shown in Table 1. Four different die can be packaged in various ways to produce four different products. A "Y" (for "yes") indicates that the die named at the top of the column can be used to generate the product named at the left of the row. Thus, each "Y" corresponds to an available packaged IC die.

The four products are shown in the leftmost column of the table. The LX50T product corresponds, for example, to the PLD structure shown in FIG. 3. The LX50 corresponds, for example, to the structures shown in FIGS. 4 and 7. Note that either of the two structures shown in FIGS. 4 and 7 yields the same product. The LX30T corresponds to the structures shown in FIGS. 5 and 8, and the LX30 corresponds to the structures shown in FIGS. 6 and 9.

The four die are shown in the top row of the table. The "30" die corresponds, for example, to the structure shown in FIG. 9. The "30T" die corresponds, for example, to the structure shown in FIG. 8. The "50" die corresponds, for example, to the structure shown in FIG. 7. The "50T" corresponds to any of the structures shown in FIGS. 3-6.

Note that in this exemplary PLD product family, all but the smallest of the three smaller die can also be used to generate yet smaller products. For example, referring to FIG. 7, the "50" die can also be used to generate a "LX30" product in which only portion "A" is operational, and portions B(1) and B(2) are non-operational.

TABLE 1

| | \Die | | | |
|---|---|---|---|---|
| Product\ | 30 | 30T | 50 | 50T |
| LX30 | Y | Y | Y | Y |
| LX30T | | Y | | Y |
| LX50 | | | Y | Y |
| LX50T | | | | Y |

In some embodiments, all of the packaged IC dies (i.e., each box with a "Y" in Table 1) are packaged using packages of the same size and type.

In one embodiment, all of the packaged dies in each row use the same package, but each row uses a different package for the dies in that row. For example, the LX30 product uses a first package whether derived from any of the 30, 30T, 50, and 50T dies, but the LX30T product uses a second package different from the first package in at least one of size and type. In this embodiment, each product (e.g., LX30, LX30T, etc.) can have its own product selection code, and the product selection code can be included in the package rather than being encoded using fuses or external wiring. In this embodiment, for example, the product selection codes might be, for example, as shown in Table 2.

TABLE 2

| | \Die | | | |
|---|---|---|---|---|
| Product\ | 30 | 30T | 50 | 50T |
| LX30 | 00 | 00 | 00 | 00 |
| LX30T | | 10 | | 10 |
| LX50 | | | 01 | 01 |
| LX50T | | | | 11 |

It might at some time be considered an advantage to reduce the number of unique package piece parts utilized by the family of PLDs shown in Table 2. To provide this additional flexibility, the product selection codes can be assigned in such a way that they include "don't-care" values, as shown in Table 3. In Table 3, an "X" indicates a "don't-care" value. In the embodiment of Table 3, a "30" die can be packaged in either the "LX30-type" package used by the products in the first row (with a product selection code of "00") or in the "LX50-type" package used by the products in the third row (with a product selection code of "01"). Similarly, a "30T" die can be packaged in either the "LX30T" type of package used by the products in the second row (with a product selection code of "10") or in the "LX50T-type" package used by the products in the fourth row (with a product selection code of "11"). Thus, the product selection code in this embodiment indicates the package type and size, and not the product itself.

TABLE 3

| | \Die | | | |
|---|---|---|---|---|
| Product\ | 30 | 30T | 50 | 50T |
| LX30 | 0X | 0X | 00 | 00 |
| LX30T | | 1X | | 10 |
| LX50 | | | 01 | 01 |
| LX50T | | | | 11 |

Returning now to FIG. 11, the same package pinout is preferably used for the packaged IC dies produced from steps 1103 and 1105, to enable the transparent substitution of one of the packaged dies for the other. Thus, for example, a system designed to accept the packaged IC from step 1103 exhibits the same functionality when the packaged IC from step 1105 is substituted. The larger die (the packaged IC from step 1103) is likely to have a higher leakage current than the smaller die (the packaged IC from step 1105), but unless the leakage current is close to system tolerance, this minor variation should not affect the functionality of the system. Further, a system designed to accept the packaged IC with a larger leakage current (i.e., the first-manufactured die) should continue to function properly when and if a packaged IC with a smaller leakage current (i.e., the later-manufactured die) is used.

In some embodiments, when the IC dies are PLD dies, the packaged IC resulting from step 1103 is programmed with a configuration bit stream smaller than the packaged IC resulting from step 1102, because only the first portion of the packaged IC resulting from step 1103 is operational. In these embodiments, the packaged IC resulting from step 1105 preferably uses the same configuration bit stream as the packaged IC resulting from step 1103, again to enable the transparent substitution of one of the packaged dies for the other.

Note that some publicly available PLDs have previously been manufactured in which certain portions of the configurable logic were deliberately "blacked out" by instructing the PLD implementation software to ignore certain areas of the dies. For example, a PLD including four columns of block RAM was sold as a less expensive version of the die including only two columns of block RAM, to avoid incurring the higher costs of testing the extra two columns of block RAM. Thus, the end cost to the PLD user was reduced.

However, this known "family" of PLDs differed from those described herein in several important ways, including but not limited to the following. For example, the PLD with two columns of block RAM was not manufactured as a stand-alone product. Further, the packaged PLD was not encoded with a product selection code that controlled the behavior of the packaged PLD. Instead, the PLD implementation software determined whether or not to use the two additional columns of block RAM based on which PLD was being targeted. Yet further, the two additional columns of block RAM were always configured, whether or not they were being used by the design. Thus, the configuration bit stream for both products was the same size.

In addition to reducing initial manufacturing costs for products having a relatively small end demand, the methods disclosed herein can also reduce ongoing manufacturing costs due to defective dies. As IC dies grow larger, the likelihood that a defect will be included in a given die increases at a rate even larger than the die size. Therefore, it is generally desirable to improve the manufacturing yield by enabling the use of dies that include localized manufacturing defects.

Figure 14:
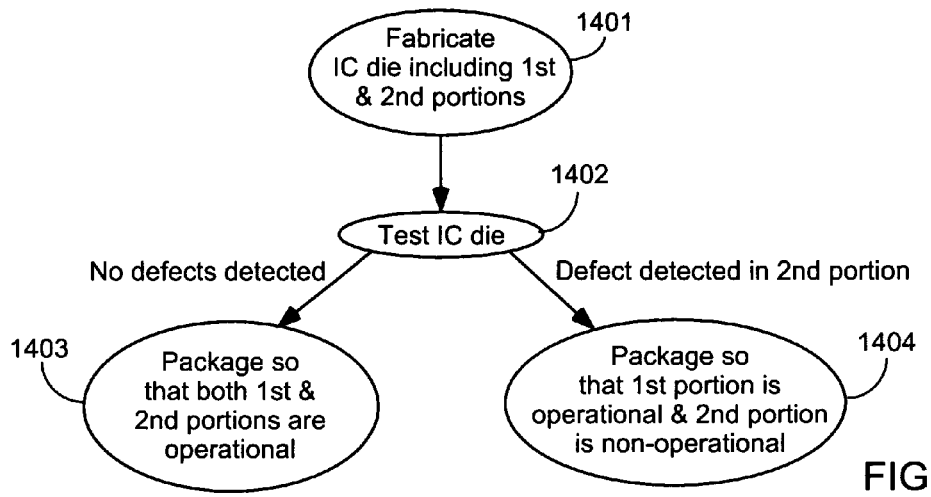
FIG. 14 illustrates the steps of an exemplary method of providing a family of packaged ICs.

FIG. 14 illustrates the steps of an exemplary method of enhancing the yield of IC devices using a multi-product die, e.g., such as those described herein. In step 1401, an IC die is fabricated that include first and second portions. In step 1402, the IC die is tested. When no localized defects are detected, in step 1403 the IC die is packaged with a first product selection code that enables both portions of the IC die. For example, when the IC die is a PLD die, the first product selection code can enable programming of both portions of the PLD die. (Note that it is also possible to package an IC die with no localized defects using a product selection code that enables only a portion of the IC die, if desired.)

When localized defects are detected in the second portion of the die, in step 1404 the IC die is packaged with a second product selection code that enables the first portion, but disables the second portion, of the IC die. For example, when the IC die is a PLD die, the second product selection code can enable programming of the first portion, and disable programming of the second portion, of the PLD die. When defects are detected that adversely affect the first portion of the die (not shown), the IC die can be discarded, if desired.

Various approaches can be used to test the multi-product die and identify the location of any localized defect. For example, a first set of tests could test the functionality associated with the largest possible family member (i.e., the family member including all portions of the die). If the first set of tests passes, then the testing is complete. If the first set of tests fails, a second set of tests could be applied that tests the functionality associated with a smaller family member (i.e., a family member including only a subset of the die), and so forth. In another embodiment, the tests could be written to test all functionality of the entire multi-product die and to identify from the test results the location of the localized defects.

Figure 15:
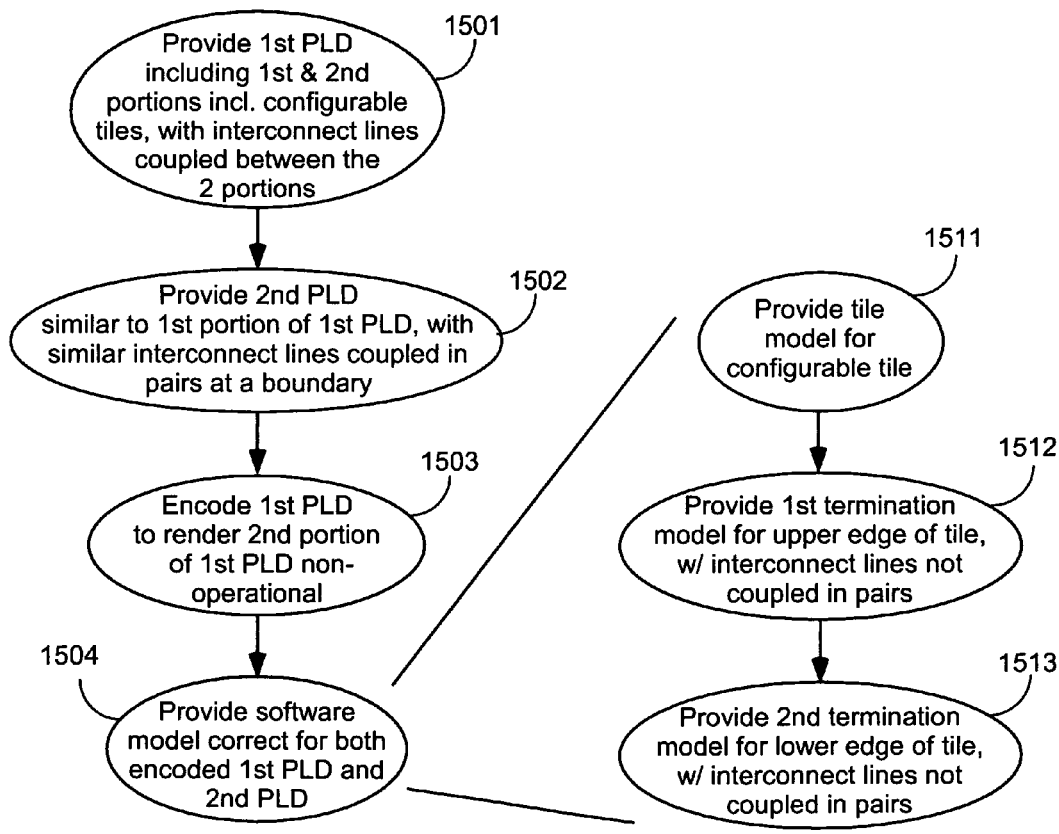
FIG. 15 illustrates the steps of an exemplary method of modeling multiple PLDs having similar functionality but different hardware implementations.

FIG. 15 illustrates the steps of an exemplary method of modeling multiple PLDs having similar functionality, but different hardware implementations. For example, this method can be used to model corresponding PLDs as shown in FIGS. 4 and 7, FIGS. 5 and 8, or FIGS. 6. and 9.

In step 1501, a first PLD is provided that includes first configurable tiles and first interconnect lines coupled between the tiles. The first PLD is logically divisible into first and second portions, with each of the portions including some of the configurable tiles. (The first PLD cannot necessarily be physically divided into the first and second portions without disrupting the functionality of one or both of the two portions.) Each of the first interconnect lines has a first section included in the first portion and a second section included in the second portion.

In step 1502, a second PLD is provided that includes second configurable tiles and is substantially similar to the first portion of the first PLD. The second PLD also includes second interconnect lines coupled to the second configurable tiles. The second interconnect lines are substantially similar to the first sections of the first interconnect lines. Each of the second interconnect lines is coupled to another of the second interconnect lines at a boundary of the second PLD to form pairs of the second interconnect lines. These interconnections are further described below, in connection with FIGS. 17 and 20.

In step 1503, the first PLD is encoded to render the second portion of the first PLD non-operational. For example, the first PLD can be encoded to enable programming of the first portion and disable programming of the second portion, to disconnect power from the second portion, and/or render the second portion transparent to a system including the first PLD. In one embodiment, the first PLD is similar to PLD 300 of FIG. 3, for example, and the second PLD is similar to the PLD illustrated in FIG. 8. In this embodiment, the encoded first PLD resulting from step 1503 resembles the PLD illustrated in FIG. 5.

In step 1504, a software model is provided that is correct for both the second PLD from step 1502 and the encoded first PLD from step 1503, even though the two PLDs have physical differences. Exemplary software models having this capability are described below in conjunction with FIGS. 16-21.

One implementation of step 1504 is shown in steps 1511-1513. Each of the first and second PLDs includes configurable tiles that are substantially similar to one another. (Note that additional configurable tiles different from each other can also be included in one or both of the PLDs.) In step 1511, a tile model is provided for the configurable tile. This software model represents one of the configurable tiles in the first and second PLDs. Because the configurable tiles are substantially similar, the same tile model can be used for the configurable tiles in each PLD. This type of software model, modeling a standard configurable tile, is well known.

In step 1512, a first termination model is provided that can be applied above the upper edge of one of the configurable tiles. For example, in the second PLD the first termination model can be applied above the row of tiles along the upper edge of the second PLD. In the first PLD, the first termination model can be applied above the top row of configurable tiles included in the first portion of the PLD. As is clear from the above description, interconnect lines along the upper edge of the configurable tile can be coupled into pairs (e.g., at the top edge of the second PLD, as described above) or can continue on to an adjacent configurable tile above (e.g., interconnect lines at the top edge of the first portion of the first PLD continue into the second portion of the PLD). However, the first (upper) termination model is the same for both PLDs.

It will be understood that the terms "above", "below", "upper", "lower", "northward", "southward", "left", "right", and so forth as used herein are relative to one another and to the conventions followed in the figures and specification, and are not indicative of any particular orientation of or on the physical dies. Note also that the terms "column" and "row" are used to designate direction with respect to the figures herein, and that a "column" in one embodiment can be a "row" in another embodiment.

In step 1513, a second termination model is provided that can be applied below the lower edge of one of the configurable tiles. For example, in the second PLD the second termination model can be applied below the row of tiles along the lower edge of the second PLD. In the first PLD, the second termination model can be applied below the bottom row of configurable tiles included in the first portion of the PLD. As is clear from the above description, interconnect lines along the lower edge of the configurable tile can be coupled into pairs (e.g., at the bottom edge of the second PLD, as described above) or can continue on to an adjacent configurable tile below (e.g., interconnect lines at the bottom edge of the first portion of the first PLD continue into the second portion of the PLD). However, the second (lower) termination model is the same for both PLDs.

In some embodiments, a single speeds file is provided as part of, or along with, the upper and lower termination models. In other words, a single computer file can be used to describe the timing for both the second PLD and the first PLD, when the first PLD is encoded to behave in the same manner as the second PLD. In some embodiments, providing a single speeds file for both the second PLD and the first PLD (when the first PLD is encoded to behave in the same manner as the second PLD) enables either of these devices to be shipped to a customer interchangeably, by ensuring that both products use the same software. The timing is the same for the two PLD dies because of the manner in which the interconnect lines are implemented and modeled, as is now described.

Figure 16:
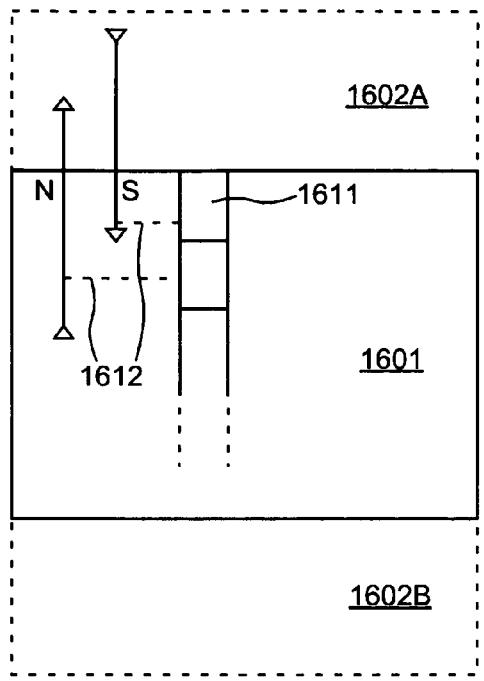
FIG. 16 illustrates how unidirectional interconnect lines can be implemented at the optional internal boundaries of a multi-product die.
Figure 17:
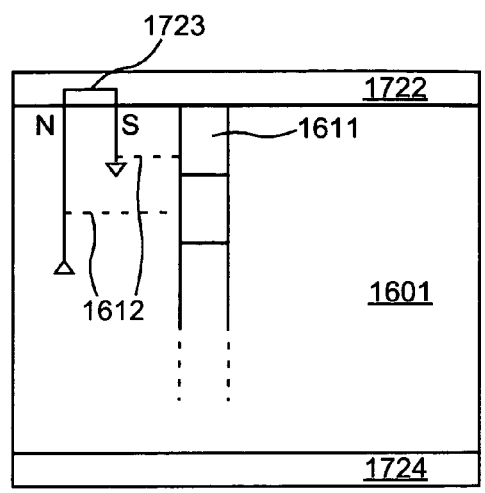
FIG. 17 illustrates how the unidirectional interconnect lines of FIG. 16 can be modified when manufacturing a second die that includes only a portion of the multi-product die of FIG. 16.
Figure 18:
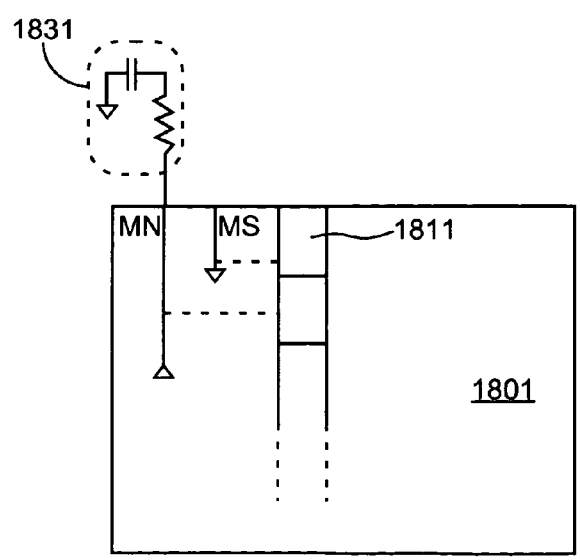
FIG. 18 illustrates how the unidirectional interconnect lines of FIGS. 16 and 15 can be modeled using a single software model.
Figure 19:
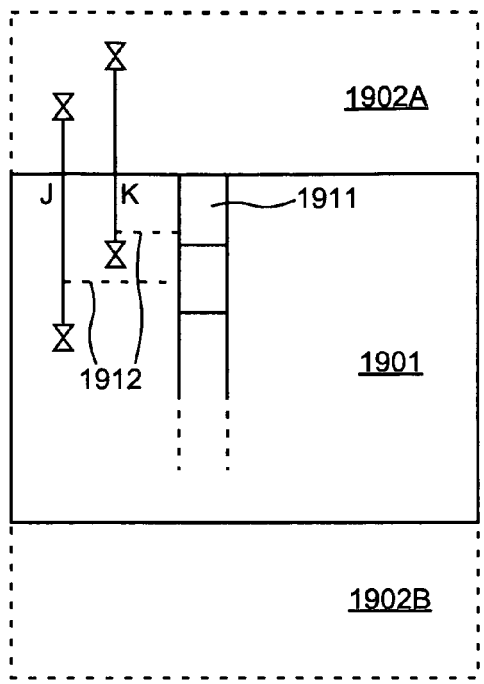
FIG. 19 illustrates how bidirectional interconnect lines can be implemented at the optional internal boundaries of a multi-product die.
Figure 20:
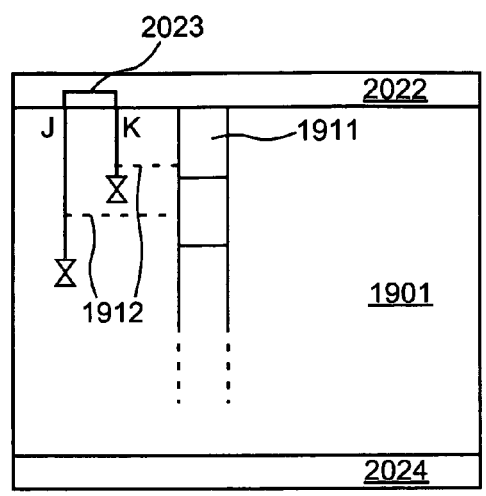
FIG. 20 illustrates how the bidirectional interconnect lines of FIG. 19 can be modified when manufacturing a second die that includes only a portion of the multi-product die of FIG. 19.
Figure 21:
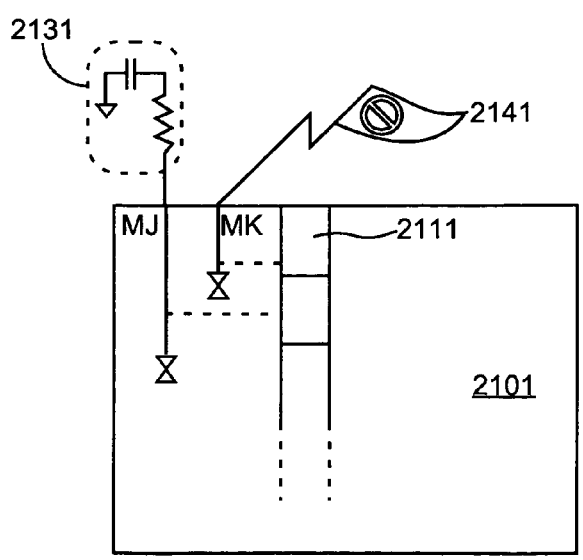
FIG. 21 illustrates how the bidirectional interconnect lines of FIGS. 19 and 20 can be modeled using a single software model.

Examples of upper termination models are now described in conjunction with FIGS. 16-21. FIGS. 16-18 illustrate how unidirectional interconnect lines can be modeled such that the same model can be applied for continuing and paired interconnect lines. FIGS. 19-21 illustrate how bidirectional interconnect lines can be modeled such that the same model can be applied for continuing and paired interconnect lines. Lower termination models can be similar to the upper termination models.

FIG. 16 illustrates how unidirectional interconnect lines can be implemented at the optional internal boundaries of a multi-product die, e.g., at the upper boundary between a first portion and a second portion of the die. The PLD illustrated in FIG. 16 includes a first portion (1601) and a second portion (1602A/B), and is encoded to render the first portion of the die operational and the second portion non-operational. Two interconnect lines N and S are programmably coupled to configurable tiles 1611 via programmable connections 1612. Northward traveling interconnect line N begins in the first portion and extends into the second portion. Southward traveling interconnect line S begins in the second portion and extends into the first portion. Interconnect lines N and S are of the same length (e.g., span the same number of tiles), and form a pair of interconnect lines in which the section of interconnect line N within the first portion of the PLD is the same length as the section of interconnect line S within the second portion of the PLD. For example, if the section of interconnect line N within the first portion spans three tiles, and the section of interconnect line N within the second portion spans two tiles, then interconnect line S displays the opposite configuration. That is, the section of interconnect line S within the second portion spans three tiles, and the section within the first portion spans two tiles.

FIG. 17 illustrates how unidirectional interconnect lines N and S appear in the second PLD, which includes the first portion 1601 of the first PLD, while the second portion 1602A/B of the first PLD die is physically omitted from the second PLD die. An upper row of termination tiles 1722 is added above the top row of configurable tiles in the first section 1601, and a lower row of termination tiles 1724 is added below the bottom row of tiles. Exemplary interconnect lines N and S are coupled together in the upper termination tile using interconnection 1723. Thus, interconnect line N/S has essentially the same length and the same loading as interconnect line N and interconnect line S in the first PLD of FIG. 16. In other words, the length and loading will vary only insignificantly because of the added interconnection 1723.

Note that the numbers of N and S interconnect lines are preferably the same, and the two kinds of vertical interconnect lines are preferably symmetrical and arranged as described above to facilitate this implementation. For example, the spacing, the loading, and the processing layers (e.g., metal layers) used to implement the N and S interconnect lines are preferably well-matched.

The coupling together of interconnect lines in pairs at a boundary is a known approach to the process of creating a family of differently-sized PLDs. However, if traditional software modeling were applied to the two PLDs of FIGS. 16 and 17, two different software models would be required for the two PLDs. For example, the software model for the PLD of FIG. 16 would show that interconnect line N extended northward into the second portion of the PLD. The software model for the PLD of FIG. 17 would show that interconnect line N looped around through interconnection 1723 and returned into the first portion. However, in this case, the two PLDs could not be used interchangeably in a system, because a design implemented in the second PLD, for example, might take advantage of the loop-back that is unavailable in the first PLD. Thus, some of the advantage of the multi-product die approach would be lost.

In order to enable software modeling of a multi-product die such as those described herein, a new modeling method has been developed in which a single software model can be applied to both the encoded first PLD (FIG. 16) and the second PLD (FIG. 17). Such a software model for the upper termination tile is illustrated in FIG. 18. The software model of FIG. 18 applies only to unidirectional interconnect lines at a boundary, in this example at the upper boundary of the first portion 1601.

The software model 1801 for the first portion includes interconnect lines MN and MS, and configurable tiles 1811, corresponding to the interconnect lines N, S and tiles 1611 of FIGS. 16 and 17. However, a model of the termination tile includes an RC circuit 1831 coupled to model MN for interconnect line N. This RC circuit models the loading of the portion of interconnect line N that extends upward into the second portion of the die. Notice that interconnection 1723 between interconnect lines N and S is not modeled. Therefore, this interconnection will not be used by the PLD implementation software, and resulting design implementations can be used by either the encoded first PLD of FIG. 16 or the second PLD of FIG. 17. However, interconnection 1723 is physically provided in the second PLD die, so that interconnect line N displays the same loading characteristics as the corresponding interconnect line in the PLD of FIG. 16. Because interconnect line S will not be used, no RC circuit need be modeled for interconnect line S.

In some embodiments, the MS interconnect line is simply omitted from the model. Because this interconnect line cannot be used, no useful information is lost.

FIGS. 19-21 illustrate how bidirectional interconnect lines can be modeled using a single software model when the multi-product die approach is used. FIG. 19 illustrates how bidirectional interconnect lines can be implemented at the optional internal boundaries of a multi-product die, e.g., at the upper boundary between a first portion and a second portion of the die. The PLD illustrated in FIG. 19 includes a first portion (1901) and a second portion (1902A/B), and is encoded to enable the first portion and disable the second portion of the die. Two interconnect lines J and K are programmably coupled to configurable tiles 1911 via programmable connections 1912. Interconnect lines J and K can be driven from either end, and can optionally be driven from some other point in the interconnect line as well. Interconnect lines J and K are of the same length (e.g., span the same number of tiles), and form a pair of interconnect lines in which the section of interconnect line J within the first portion of the PLD is the same length as the section of interconnect line K within the second portion of the PLD. For example, if the section of interconnect line J within the first portion spans three tiles, and the section of interconnect line J within the second portion spans two tiles, then interconnect line K displays the opposite configuration. That is, the section of interconnect line K within the second portion spans three tiles, and the section within the first portion spans two tiles.

FIG. 20 illustrates how bidirectional interconnect lines J and K appear in the second PLD, which includes the first portion 1901 of the first PLD, while the second portion of the first PLD die is physically omitted from the second PLD die. An upper row of termination tiles 2022 is added above the top row of configurable tiles in the first section 1901, and a lower row of termination tiles 2024 is added below the bottom row of tiles. Exemplary interconnect lines J and K are coupled together in the upper termination tile using interconnection 2023. Thus, interconnect line J/K has essentially the same length and the same loading as interconnect line J and interconnect line K in the first PLD of FIG. 19. In other words, the length and loading will vary only insignificantly because of the added interconnection 2023.

Similar to the case of the unidirectional interconnect lines N and S, if traditional software modeling were applied to the two PLDs of FIGS. 19 and 20, two different software models would be required for the two PLDs. Thus, the two PLDs could not be used interchangeably in a system, and some of the advantage of the multi-product die approach would be lost.

FIG. 21 illustrates a software model for the bidirectional interconnect lines J and K of FIGS. 19 and 20. This software model can be applied to both the encoded first PLD (FIG. 19) and the second PLD (FIG. 20). The software model of FIG. 21 applies only to bidirectional interconnect lines at a boundary, in this example at the upper boundary of the first portion 1901.

The software model 2101 for the first portion includes interconnect lines MJ and MK, and configurable tiles 2111, corresponding to the interconnect lines J, K and tiles 1911 of FIGS. 19 and 20. A model of the termination tile includes an RC circuit 2131 coupled to model MJ for interconnect line J. This RC circuit models the loading of the portions of interconnect line J that extend upward into the second portion of the die. However, note that no RC circuit is included for model MK for interconnect line K. In the second PLD (FIG. 20), interconnect lines J and K are shorted together via interconnection 2023. This interconnection ensures that the loading for interconnect lines J and K is consistent between the encoded first PLD of FIG. 19 and the second PLD of FIG. 20. However, the interconnection also means that if interconnect line J is used, interconnect line K cannot be used to route a different signal. Therefore, the software model in FIG. 21 includes a flag 2141 that flags interconnect line K (modeled by MK) invalid for use by routing software for the PLD. Note that in the embodiment of FIG. 21, either of interconnect lines J and K could have been selected to be used in the model, with the other of the two interconnect lines being flagged as invalid. Preferably, the longer of the two interconnect lines is used, with the shorter interconnect line being flagged as invalid, to increase the usefulness of the modeled interconnect line.

In some embodiments, the flag 2141 is implemented by removing in the software model all programmable connections (programmable interconnect points, or PIPs) providing access onto and off of interconnect line K (model MK). In some embodiments, the MK interconnect line is simply omitted from the model. Because this interconnect line cannot be used, no useful information is lost.

Notice that interconnection 2023 between interconnect lines J and K is not modeled. Therefore, this interconnection will not be used by the PLD implementation software, and resulting design implementations can be used by either the encoded first PLD of FIG. 19 or the second PLD of FIG. 20. However, interconnection 2023 is physically provided in the second PLD die, so that interconnect lines J and K display essentially the same loading characteristics as the corresponding interconnect lines in the PLD of FIG. 19.

Returning to FIG. 18, note that the flag 2141 that is included for the bidirectional interconnect lines (FIG. 21) is not needed for the unidirectional interconnect line model shown in FIG. 18. The unidirectional interconnect lines have only one driver, at the source end of the interconnect line. Therefore, interconnect line S cannot be driven from within the first portion 1601 of the die. Hence, it is not necessary to flag the interconnect line as unusable when only the first portion of the die is in use.

In some embodiments, the left and right edges of the die also include termination tiles, which can be similar to the upper and lower termination tiles, or can be implemented in a different fashion. In one embodiment, the left termination tiles are modeled to accurately reflect the "U-turns" performed by the interconnect lines along the left edge of the die. This approach works correctly in this instance, because the left edge of the die is the same for each of the full and partial die. The right termination tiles cannot be modeled to accurately reflect the die, because there is an optional boundary along the right-hand edge of some partial die. Therefore, the right termination tiles are modeled in a fashion similar to the upper and lower termination tiles, for at least the partial die that terminate at the optional boundary.

As previously described, the multi-product die described herein can be encoded to render first portion(s) of the die operational, and to render second portion(s) of the die non-operational. As noted above, a non-operational portion of the die can be made non-operational in one or more of several ways. For example, the product selection code can disconnect the second portion from the IC power supply. In some embodiments, the product selection code simply disconnects signal sources in the second portion from destinations located in the first portion and/or from IC pads. Thus, the second portion continues to function, but is transparent to the system of which the IC forms a part. In other embodiments, the non-operational portion of the die is simply disabled using an enable/disable signal. These and other methods of rendering a circuit non-operational are encompassed by the present description. Thus, the term "operational" as used herein generally refers to the ability to perform logical functions in a manner that affects a system, while the term "non-operational" generally means an inability to affect such a system.

Figure 22:
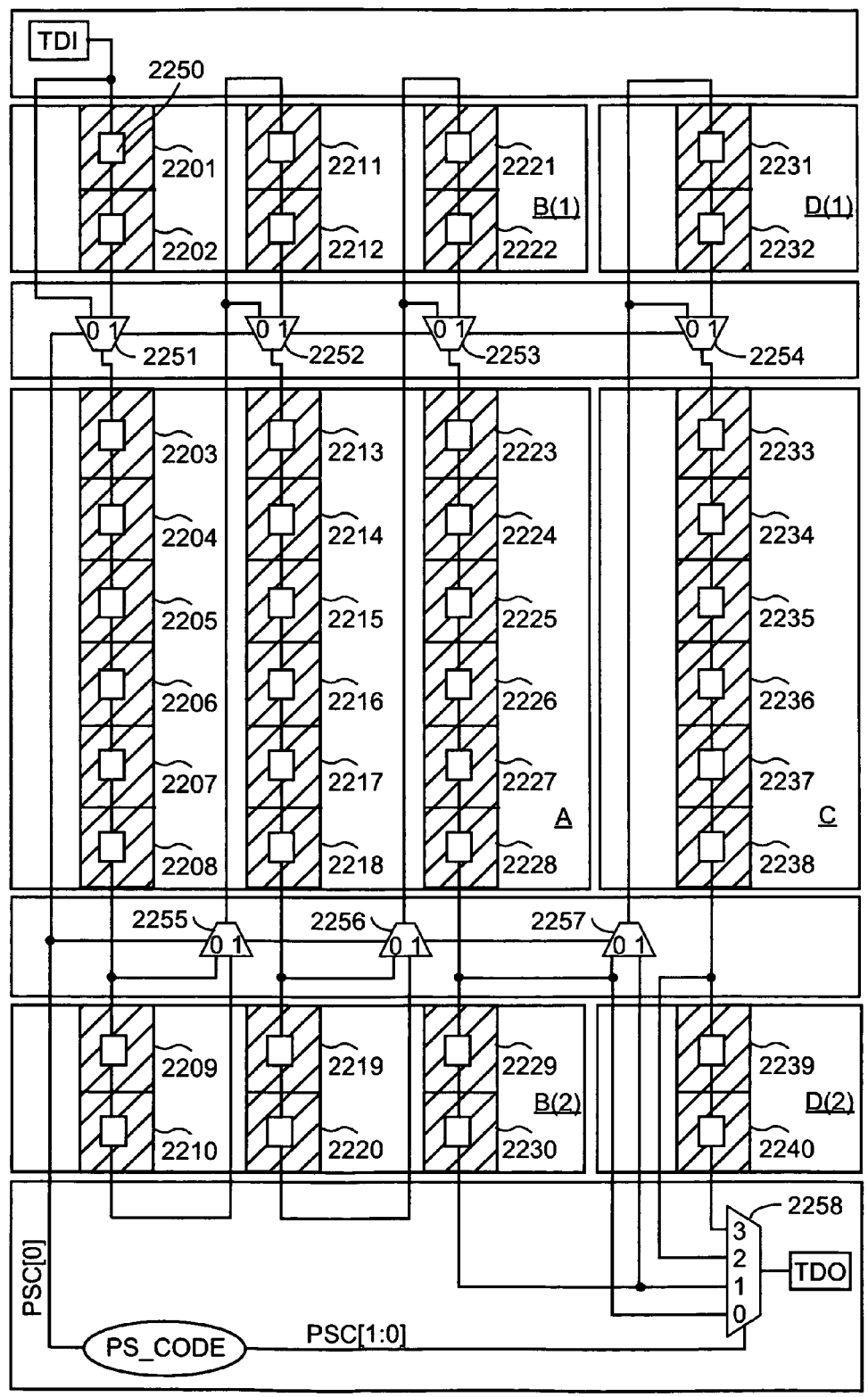
FIG. 22 illustrates a multi-product IC die in which a boundary scan chain includes only the operational portions of the multi-product die, based on a product selection code.

In some embodiments, when a portion of an IC has been made transparent to a system, the boundary scan chain is configured to skip over the non-operational portion of the IC die, i.e., any parts of the boundary scan chain through the non-operational portion are bypassed. FIG. 22 illustrates an exemplary die in which a portion of the die can be removed from the boundary scan chain based on the value of a product selection code. Note that while the IC die pictured in FIG. 22 is a PLD die, this type of arrangement can also be applied to a non-programmable or partially-programmable integrated circuit.

The IC die of FIG. 22 is divided into several different portions, which correspond in this example to the portions A, B(1), B(2), C, D(1), and D(2) of FIG. 3. Thus, FIG. 22 provides an implementation of a configurable boundary scan chain that can be used in the multi-product die illustrated in FIG. 3. In the embodiment of FIG. 22, a product selection code (PSC[1:0]) value of 1,1 configures the boundary scan chain to include the input/output blocks in all of portions A, B(1), B(2), C, D(1), and D(2). A product selection code (PSC[1:0]) value of 1,0 configures the boundary scan chain to include the input/output blocks in portions A and C, and omit the input/output blocks in portions B(1), B(2), D(1), and D(2). A product selection code (PSC[1:0]) value of 0,1 configures the boundary scan chain to include the input/output blocks in portions A, B(1), and B(2), and omit the input/output blocks in portions C, D(1), and D(2). A product selection code (PSC[1:0]) value of 0,0 configures the boundary scan chain to include only the input/output blocks in portion A, omitting the input/output blocks in portions B(1), B(2), C, D(1), and D(2). In some embodiments, the boundary scan chain includes logic blocks other than the input/output blocks.

The multi-product die of FIG. 22 includes tiles 2201-2040, logic elements 2250 included in the tiles, multiplexers 2251-2258, boundary scan input pad TDI (Test Data In), boundary scan output pad TDO (Test Data Out), and selection code storage circuit PS_CODE, coupled together as shown in FIG. 22. The selection code storage circuit stores a product selection code PSC[1:0]. A low value for signal PSC[0] selects "hide rows", i.e., hide portions B(1), D(1), B(2), and D(2). Therefore, when signal PSC[0] has a low value, multiplexer 2251 selects the boundary scan signal that bypasses tiles 2201-2202, multiplexer 2252 selects the boundary scan signal that bypasses tiles 2211-2212, multiplexer 2253 selects the boundary scan signal that bypasses tiles 2221-2222, and multiplexer 2254 selects the boundary scan signal that bypasses tiles 2231-2232. Similarly, multiplexer 2255 selects the boundary scan signal that bypasses tiles 2209-2210, multiplexer 2256 selects the boundary scan signal that bypasses tiles 2219-2220, and multiplexer 2257 selects the boundary scan signal that bypasses tiles 2229-2230. 4-input multiplexer 2258 selects either the boundary scan output from portion C (when PSC[1] is high) or the boundary scan output from the last column of portion A (when PSC[1] is low).

A low value for signal PSC[1] selects "hide columns", i.e., hide portions D(1), C, and D(2). Therefore, when signal PSC[1] has a low value, 4-input multiplexer 2259 selects either the boundary scan output from the last column of portion B(2) (when PSC[0] is high) or the boundary scan output from the last column of portion A (when PSC[1] is low).

In some embodiments, multiplexers similar to multiplexers 2251-2257 are added between additional rows of logic elements, in order to facilitate the design process. For example, a row of multiplexers similar to multiplexers 2251-2257 can be added wherever a column of input/output blocks intersects a clock regional boundary.

In some embodiments, more than one bit is provided for "hide rows" and/or "hide columns". In these embodiments, the number of variations increases with the number of bits provided, as will be clear to those of skill in the relevant arts.

Note that in some embodiments, signals other than boundary scan signals can span more than one portion of the multi-product dies, and the methods described herein can also be applied to these other signals. The multi-product die is preferably designed to allow these signals to operate in the same manner for all implementations of a given product. For example, vertical signals can be designed to enter the bottom edge of a tile in the same fashion whether coming from an adjacent tile included in the same portion, or from a tile in a different portion of the die.

In some embodiments, when a second portion of a multi-product PLD die is non-operational, the second portion is made transparent to the configuration bitstream. Thus, the second portion is not configured, or remains in a default, non-operational state. In some embodiments, the ability to change the configuration flow of a multi-product die is implemented in a fashion similar to that shown for the boundary scan chain in FIG. 22. However, in many PLDs the configuration bitstream is written as a series of frames, rather than as a serial bitstream.

Figure 23:
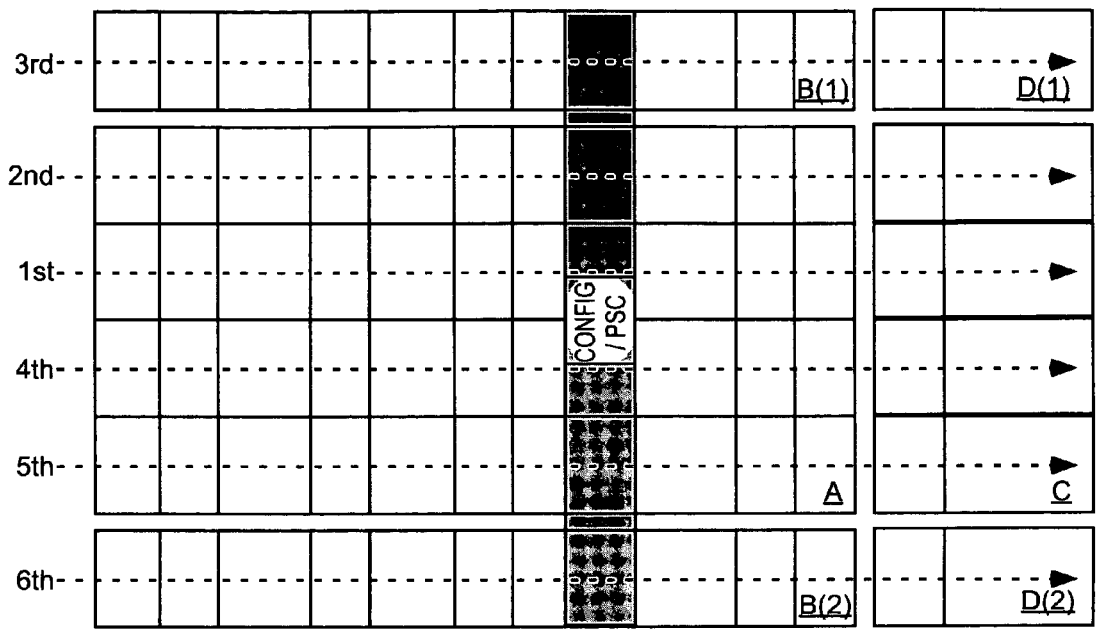
FIG. 23 illustrates how an exemplary multi-product PLD die is configured when a first product selection code enables programming of the entire die.
Figure 24:
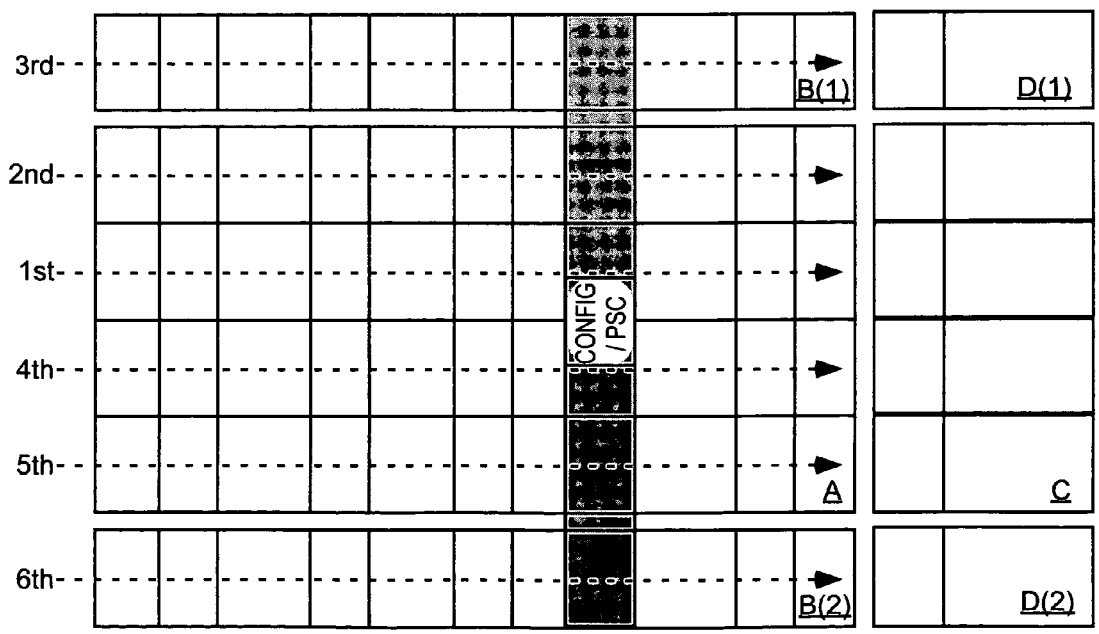
FIG. 24 illustrates how the multi-product PLD die of FIG. 23 is configured when a second product selection code enables programming of only first portions of the die.
Figure 25:
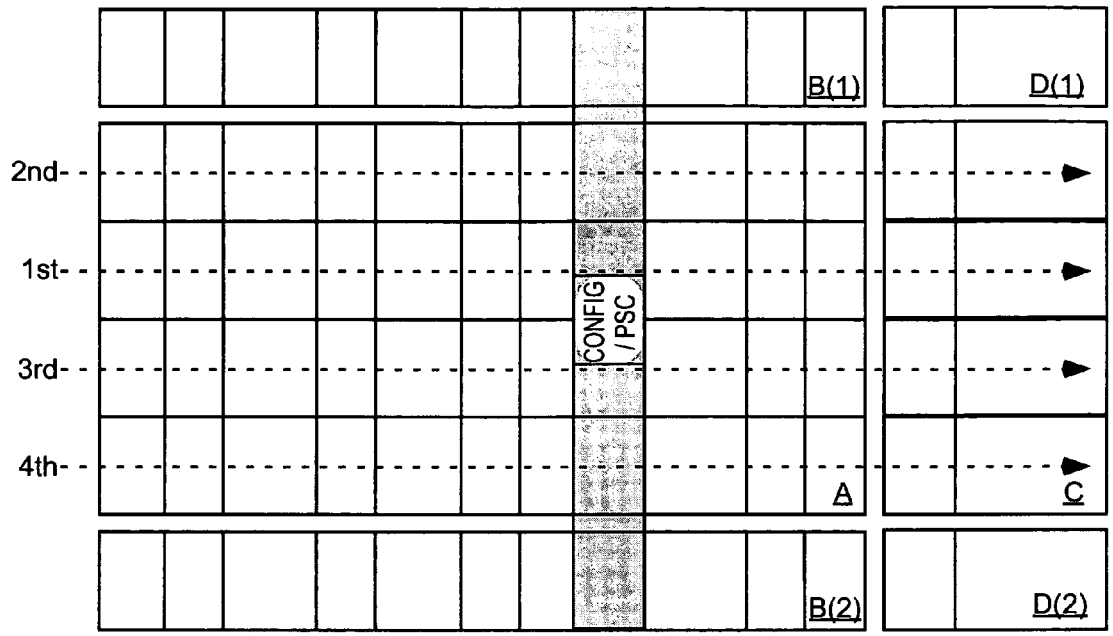
FIG. 25 illustrates how the multi-product PLD die of FIG. 23 is configured when a third product selection code enables programming of only second portions of the die.
Figure 26:
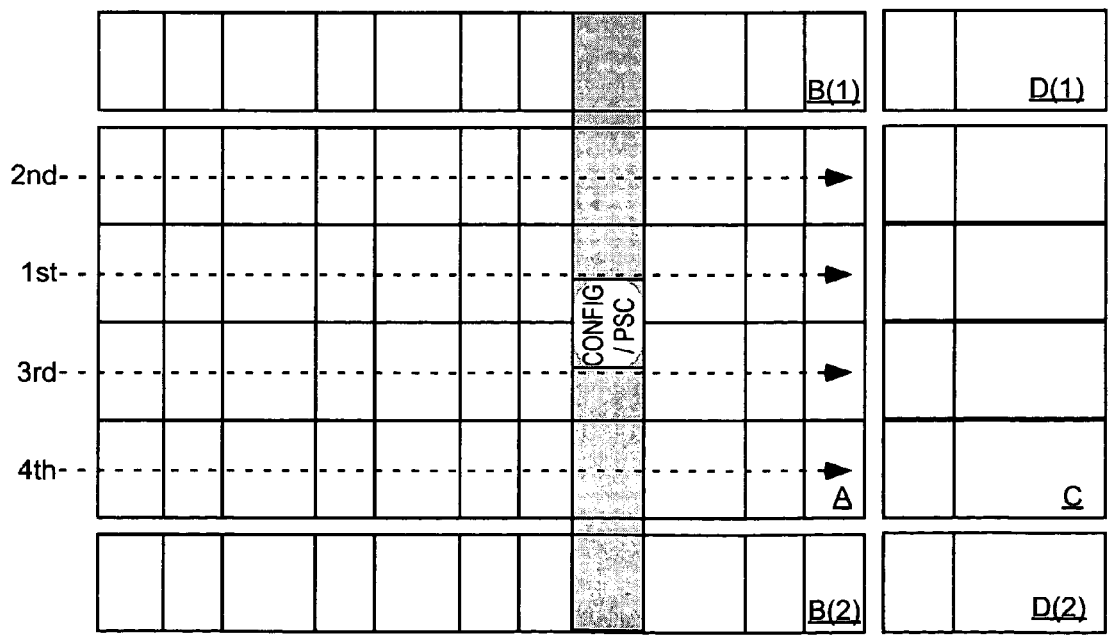
FIG. 26 illustrates how the multi-product PLD die of FIG. 23 is configured when a fourth product selection code enables programming of only third portions of the die.

In these embodiments, the size of a frame is preferably smaller than the full height of the PLD. Configuration data is provided to the PLD using a segmented configuration frame, such that only some of the rows of tiles are addressed by each frame. For example, FIGS. 23-26 illustrate four different configuration sequences that can be utilized for a single multi-product die, such that four different products result. FIG. 23 illustrates a configuration sequence that can be used, for example, to yield the fully-configured product of FIG. 3. FIG. 24 illustrates a configuration sequence that can be used to yield the product of FIG. 4. FIG. 25 illustrates a configuration sequence that can be used to yield the product of FIG. 5. FIG. 26 illustrates a configuration sequence that can be used to yield the product of FIG. 6.

In the product of FIG. 23, all portions of the die are configured. In the pictured embodiment, the configuration data is loaded by first following the pattern shown by the arrow "1st", then the pattern shown by the arrow "2nd", and so forth until the "6th" set of rows has been configured. The result is a multi-product die in which all of the portions (A, B(1), B(2), C, D(1), and D(2)) are configured and operational.

In the product of FIG. 24, portions A, B(1), and B(2) of the die are configured. In the pictured embodiment, the configuration data is loaded by first following the pattern shown by the arrow "1st", then the pattern shown by the arrow "2nd", and so forth until the "6th" set of rows has been configured. The result is a multi-product die in which portions A, B(1), and B(2) are configured and operational, and portions C, D(1), and D(2) are unconfigured and non-operational.

When the configuration process reaches the last column to be configured, a signal (e.g., "last_col_rollover") is sent from the last column back to the configuration logic, and the process switches to the next row in the configuration sequence. The last column configured is determined, for example, by the product selection code. For example, in the embodiment of FIG. 24 the last column is the right-hand column of portions B(1), A, and B(2). Any column having the potential to be the last column to be configured (e.g., any column including the head of an arrow in any of FIGS. 23-26) includes an option cell that identifies the column as a possible last column. The option cell and the product selection code are used to determine when the column actually is the last column to be configured. When configuration of such a column is complete, the column sends the signal to the configuration logic that causes the process to switch to the next row in the configuration sequence.

In the product of FIG. 25, portions A and C of the die are configured. In the pictured embodiment, the configuration data is loaded by first following the pattern shown by the arrow "1st", then the pattern shown by the arrow "2nd", and so forth until the "4th" set of rows has been configured. The result is a multi-product die in which portions A and C are configured and operational, and portions B(1), B(2), D(1), and D(2) are unconfigured and non-operational.

In the product of FIG. 26, only portion A of the die is configured. In the pictured embodiment, the configuration data is loaded by first following the pattern shown by the arrow "1st", then the pattern shown by the arrow "2nd", and so forth until the "4th" set of rows has been configured. The result is a multi-product die in which portion A is configured and operational, and portions B(1), B(2), C, D(1), and D(2) are unconfigured and non-operational.

In some embodiments, unconfigured portions of the die default to a known state, in which all configuration memory cells are set to a low value. The PLD is designed such that when all configuration memory cells store a low value, there is no contention within the die. Therefore, in this state none of the nodes in the hidden portions of the die have an effect on the configured portions of the die. In some embodiments, a PLD includes a signal called "GHIGH" that sets all driven nodes to a low value during the configuration process, and the same signal simply remains asserted after configuration in the unconfigured regions of the die. Another signal called GPOWERDOWN is also asserted. Signal GPOWERDOWN reduces the power high value for the unconfigured regions, to avoid consuming unnecessary power. The power high value can be reduced to zero volts (ground), or to an intermediate level lower than the normal operating voltage of the die. In some embodiments, different unconfigured regions are reduced to different power high voltages.

Note that each of the four products illustrated in FIGS. 23-26 is configured with a configuration bit stream of a different size. The configuration begins with a row near the center of the die and follows the same pattern each time, from the row just above a horizontal centerline upward, then from the row just below the centerline downward. The configuration logic switches to the row just below the centerline when it receives a high value on the "last_row_rollover" signal from the last row above the centerline, and it ends the configuration process when it receives a high value on the "last_row_rollover" signal from the last row below the centerline. This sequence simplifies the configuration logic. However, in other embodiments, configuration is performed following other patterns.

Figure 27:
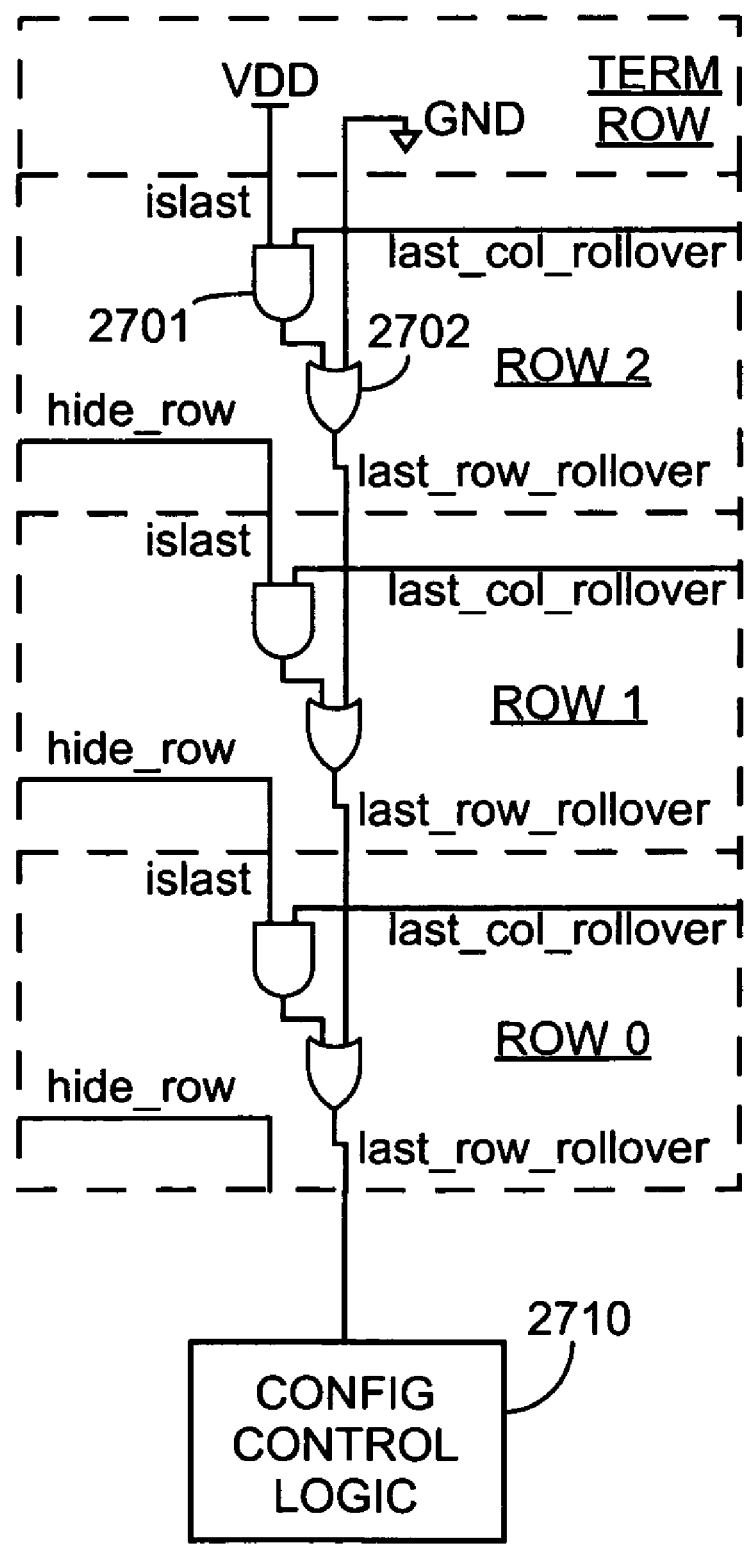
FIG. 27 illustrates one way in which the configuration process can be controlled, for example, to configure a multi-product PLD die as shown in FIGS. 23-26.

FIG. 27 illustrates one way in which the configuration process can be controlled, for example, to configure a multi-product PLD die as shown in FIGS. 23-26. Each row of tiles or logic elements (ROW 1-ROW 2 in FIG. 27) has a "hide_row" signal that is asserted whenever the row is hidden. When a row is hidden, the associated "hide_row" signal sets the "islast" signal of the previous row to a high value, thereby tagging this row as the last row to be configured. Note that the previous row is the row preceding the present row in the configuration process. In FIG. 27, the previous row is the row below the present row, and is also the adjacent row in the direction of the configuration control logic 2710.

When the "last_col_rollover" signal is asserted in the row before the hidden row closest to the configuration control logic 2710, a high value is generated on the "last_row_rollover" signal via AND gate 2701 and OR gate 2702, and is provided through the chain of OR gates to the configuration control logic 2710. Note that the last row is determined by the value of the "hide_row" signal in the next row in the configuration process, or by the VDD connection in the termination row (TERM ROW). Therefore, the selection of which row is the last row to be configured (e.g., which product will be generated from a multi-product die) can be changed simply by controlling the value of the "hide_row" signals.

Note that in the pictured embodiment, the row physically the farthest from the configuration logic still generates a correct "last_row_rollover" signal when no rows are hidden. Note also that when the hiding scheme of FIG. 27 is applied to the die of FIGS. 23-26, the logic is duplicated in the bottom half of the die (e.g., FIG. 27 shows the hiding logic only for the top half of the die). This duplication provides the added benefit of allowing asymmetrical hiding between the top and the bottom halves of the die.

Figure 28:
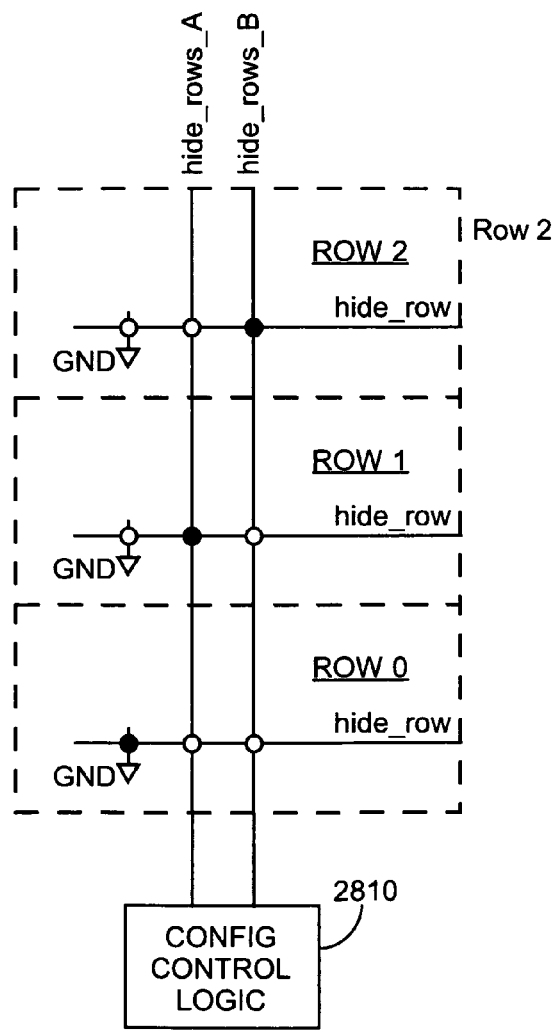
FIG. 28 illustrates a first way in which rows of logic can be hidden in a multi-product PLD die.

FIG. 28 illustrates one way in the "hide_row" signal shown in FIG. 27 can be generated in a multi-product PLD. In the embodiment of FIG. 28, a 2-bit vertical bus is used to control when rows are hidden and when they are not hidden. In some embodiments (not shown), the bus includes one bit or more than two bits. A via option (shown by a circle at the intersection of two lines) connects the "hide_row" signal of a row to one of the bits of the bus, or to ground. When the "hide_row" signal is connected to ground, the row is never hidden. When the "hide_row" signal is connected to one of the bits of the bus, the value of that bit determines whether or not the row is hidden. Thus, the association of a row with a hiding combination is fixed by the structure of the die, but whether or not that row is actually hidden depends on the value of the bus bit.

In one embodiment, each row hiding combination hides a contiguous set of rows, starting with the row(s) farthest from the configuration control logic. In one embodiment, when the "hide_row" signal has a first value the row is not included in the configuration process and any I/O blocks in that row are bypassed by the boundary scan chain. When the "hide_row" signal has a second value, the row is included in the configuration process and any I/O blocks in that row are included in the boundary scan chain.

Note that in FIG. 28, some of the circles (via options) are black and some are white. The black circles indicate via options in which a via (a physical connection) is provided between the two lines that intersect at the via. Thus, in the exemplary embodiment of FIG. 28, the "hide_row" signal in row 0 is connected to ground, the "hide_row" signal in row 1 is connected to signal "hide_rows_A", and the "hide_row" signal in row 2 is connected to signal "hide_rows_B". Table 4 shows the different hiding combinations for the embodiment of FIG. 26. The first and second columns show the values of the "hide_rows_A" and "hide_rows_B" signals. The third column shows which rows are hidden in the pictured embodiment in response to the given values.

TABLE 4

| hide_rows_A | hide_rows_B | Hidden Rows |
|---|---|---|
| 0 | 0 | No Hidden Rows |
| 0 | 1 | Hide Row 2 |
| 1 | 1 | Hide Rows 1 and 2 |

Figure 29:
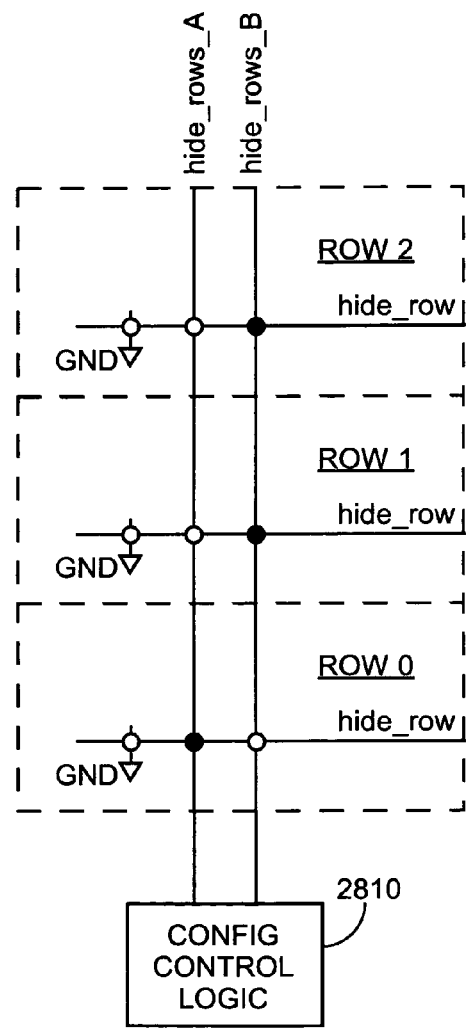
FIG. 29 illustrates a second way in which rows of logic can be hidden in a multi-product PLD die.

FIG. 29 shows the same die in which different via options are selected. In the embodiment of FIG. 29, the "hide_row" signal in row 0 is connected to signal "hide_rows_A", the "hide_row" signal in row 1 is connected to signal "hide_rows_B", and the "hide_row" signal in row 2 is connected to signal "hide_rows_B". Table 5 shows the different hiding combinations for the embodiment of FIG. 29. The first and second columns show the values of the "hide_rows_A" and "hide_rows_B" signals. The third column shows which rows are hidden in the pictured embodiment in response to the given values.

TABLE 5

| hide_rows_A | hide_rows_B | Hidden Rows |
|---|---|---|
| 0 | 0 | No Hidden Rows |
| 0 | 1 | Hide Rows 1 and 2 |
| 1 | 1 | Hide Rows 0, 1, and 2 |

In other embodiments, the "hide_row" signals are generated using other methods, e.g., tied to power high or ground, or set to known values using fuses or package options. It will be apparent to those of skill in the art that these and many other methods can be utilized to provide known values for the "hide_row" signals. In some embodiments, the values of the "hide_row" signals are controlled by the previously-described product selection code. For example, in one embodiment the values of signals "hide_rows_A" and "hide_rows_B" are determined by the product selection code (which is set by fuses or package options, for example). Signals "hide_rows_A" and "hide_rows_B" then determine the values of the "hide_row" signals depending on the via options, as described above.

Those having skill in the relevant arts of the invention will now perceive various modifications and additions that can be made as a result of the disclosure herein. For example, the above text describes the circuits of the invention in the context of programmable logic devices (PLDs) such as FPGAs and CPLDs. However, certain aspects of the invention can also be implemented in other integrated circuits, including non-programmable circuits.

Accordingly, all such modifications and additions are deemed to be within the scope of the invention, which is to be limited only by the appended claims and their equivalents.

What is claimed is:

1. A method for implementing a design in different programmable logic devices (PLDs), comprising:
   providing a first programmable logic device including a first plurality of configurable tiles and a plurality of first interconnect lines coupled to the first plurality of configurable tiles, the first PLD being logically divisible into a first portion and a second portion, wherein each of the first interconnect lines comprises a first section included in the first portion and a second section included in the second portion;
   providing a second PLD comprising a second plurality of the configurable tiles substantially similar to the first portion of the first PLD, and further comprising a plurality of second interconnect lines coupled to the second plurality of configurable tiles and substantially similar to the first sections of the first interconnect lines, wherein each of the second interconnect lines is coupled to another of the second interconnect lines at a boundary of the second PLD to form pairs of the second interconnect lines;
   wherein the second PLD does not include a second portion substantially similar to the second portion of the first PLD from the first PLD;
   encoding the first PLD to render the second portion of the first PLD non-operational;
   providing a software model to design implementation software, wherein the software model describes behavior of the encoded first PLD and further describes the behavior of the second PLD, and wherein the software model is the same for both the encoded first PLD and the second PLD;
   generating and storing an implementation of a design by the design implementation software using the software model, wherein the implementation can be used in both the first and second PLDs.

2. The method of claim 1, wherein for each pair of the second interconnect lines a total length of the pair of interconnect lines comprises N tiles, N being an integer, wherein N comprises a number of tiles included in each of the first interconnect lines.

3. The method of claim 1, wherein the pairs of the second interconnect lines comprise pairs of unidirectional interconnect lines, wherein a first interconnect line in each pair of unidirectional interconnect lines drives toward an upper edge of one of the configurable tiles and a second interconnect line in the pair of unidirectional interconnect lines drives toward a lower edge of the one configurable tile.

4. The method of claim 1, wherein providing the software model comprises:
   providing a tile model representing one of the configurable tiles;
   providing a first termination model modeling an upper edge of one of the configurable tiles; and
   providing a second termination model modeling a lower edge of the one configurable tile.

5. The method of claim 4, wherein:
   the first portion comprises columns of the tiles;
   the second portion comprises a continuation of the columns of the tiles included in the first portion, the second portion extending both above and below the first portion;
   in the first PLD, the first and second termination models are respectively applied along upper and lower boundaries of the first portion; and
   in the second PLD, the first and second termination models are respectively applied along upper and lower edges of the second PLD.

6. The method of claim 4, wherein the pairs of the second interconnect lines comprise pairs of bidirectional interconnect lines, and wherein:
   providing the first termination model comprises flagging one interconnect line in each pair of bidirectional interconnect lines along the upper edge of the one configurable tile as being invalid for use by routing software for the PLD; and
   providing the second termination model comprises flagging one interconnect line in each pair of bidirectional interconnect lines along the lower edge of the one configurable tile as being invalid for use by routing software for the PLD.

7. A method for implementing a design in different programmable logic devices (PLDs), comprising:
   providing a first programmable logic device including a first plurality of configurable tiles and a plurality of first interconnect lines coupled to the first plurality of configurable tiles, the first PLD being logically divisible into a first portion and a second portion, wherein each of the first interconnect lines comprises a first section included in the first portion and a second section included in the second portion;
   providing a second PLD comprising a second plurality of the configurable tiles substantially similar to the first portion of the first PLD, and further comprising a plurality of second interconnect lines coupled to the second plurality of configurable tiles and substantially similar to the first sections of the first interconnect lines, wherein each of the second interconnect lines is coupled to another of the second interconnect lines at a boundary of the second PLD to form pairs of the second interconnect lines;
   encoding the first PLD to render the second portion of the first PLD non-operational;
   providing a software model to design implementation software, wherein the software model describes behavior of the encoded first PLD and further describes the behavior of the second PLD, and wherein the software model is the same for both the encoded first PLD and the second PLD;

wherein the software model includes a tile model representing one of the configurable tiles, a first termination model modeling an upper edge of one of the configurable tiles, and a second termination model modeling a lower edge of the one configurable tile;

the first termination model models each of the second interconnect lines along the upper edge of the configurable tile as not being coupled to the other second interconnect line in the same pair;

the second termination model models each of the second interconnect lines along the lower edge of the configurable tile as not being coupled to the other second interconnect line in the same pair; and generating and storing an implementation of a design by the design implementation software using the software model.

8. The method of claim 7, wherein:

the first termination model applies to a second interconnect line along the upper edge of the one configurable tile an RC representing an RC of another second interconnect line in the same pair; and the second termination model applies to a second interconnect line along the lower edge of the one configurable tile an RC representing an RC of another second interconnect line in the same pair.

* * * * *